US011726113B2

(12) United States Patent
Sato et al.

(10) Patent No.: US 11,726,113 B2
(45) Date of Patent: Aug. 15, 2023

(54) CURRENT SENSOR

(71) Applicant: Panasonic Intellectual Property Management Co., Ltd., Osaka (JP)

(72) Inventors: Yuta Sato, Osaka (JP); Hirohide Ichihashi, Osaka (JP); Mitsuru Tomita, Mie (JP); Masakazu Kobayashi, Osaka (JP); Manabu Hashimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 92 days.

(21) Appl. No.: 17/432,384

(22) PCT Filed: Mar. 26, 2020

(86) PCT No.: PCT/JP2020/013546
§ 371 (c)(1),
(2) Date: Aug. 19, 2021

(87) PCT Pub. No.: WO2020/217838
PCT Pub. Date: Oct. 29, 2020

(65) Prior Publication Data
US 2022/0155351 A1    May 19, 2022

(30) Foreign Application Priority Data

Apr. 24, 2019    (JP) .................................. 2019-083170

(51) Int. Cl.
*G01R 31/18*    (2006.01)
*G01R 15/18*    (2006.01)
*G01R 19/00*    (2006.01)

(52) U.S. Cl.
CPC ....... *G01R 15/186* (2013.01); *G01R 19/0053* (2013.01)

(58) Field of Classification Search
CPC .... G01R 15/181; G01R 15/186; G01R 15/18; G01R 15/183; G01R 15/185;
(Continued)

(56) References Cited

U.S. PATENT DOCUMENTS 5,834,934 A    11/1998   Baurand et al.
5,952,819 A *  9/1999   Berkcan ................. G01R 15/20
                                                    324/96

(Continued)

FOREIGN PATENT DOCUMENTS

JP    9-166625       6/1997
JP    2012-098305    5/2012

OTHER PUBLICATIONS

International Search Report of PCT application No. PCT/JP2020/013546 dated Jun. 23, 2020.

*Primary Examiner* — Vinh P Nguyen
(74) *Attorney, Agent, or Firm* — McDermott Will & Emery LLP

(57) ABSTRACT

A current sensor is configured to detect a current flowing through an electrical conductor. The current sensor includes a core and a coil wound around the core. The core has a hollow configure to allow the electrical conductor to pass through the hollow. The core substantially has a C-shape having a gap connected to the hollow. At least a part of the gap of the core is located inside the coil. This current sensor suppresses the influence of external noise.

20 Claims, 26 Drawing Sheets

(58) Field of Classification Search
CPC .......... G01R 19/0092; G01R 19/2513; G01R 31/1272; G01R 31/14; G01R 31/00; G01R 31/343; G01R 31/72; G01R 19/145; G01R 19/15; G01R 21/06; G01R 31/346; G01R 31/50; G01R 19/14; G01R 33/385; G01R 27/2611; H01F 27/24; H01F 38/30; H01F 27/346; H01F 38/28; H01F 30/06; H01F 7/18; H01F 7/1844; H01F 21/08; H01F 27/02; H01F 17/04; H01F 27/28; H01F 41/06; H01F 41/12; H01F 5/04; H01F 7/081; H01F 27/38
See application file for complete search history.

(56) References Cited

U.S. PATENT DOCUMENTS

| | | | | |
|---|---|---|---|---|
| 6,507,261 | B1* | 1/2003 | Haga | H01F 27/306 336/208 |
| 8,692,540 | B2* | 4/2014 | Bernklau | G01R 15/186 361/620 |
| 8,933,689 | B2* | 1/2015 | Moliton | G01R 15/142 324/129 |
| 9,372,207 | B1* | 6/2016 | Brouwer | G01R 15/183 |
| 9,535,097 | B2* | 1/2017 | Davis | G01R 15/246 |
| 9,939,465 | B2* | 4/2018 | Morimoto | G01R 19/0092 |
| 2009/0115403 | A1 | 5/2009 | Bernklau | |
| 2010/0301852 | A1 | 12/2010 | Teppan et al. | |
| 2010/0308797 | A1 | 12/2010 | Zimmermann | |
| 2013/0002236 | A1 | 1/2013 | Moliton et al. | |

\* cited by examiner

FIG. 14A
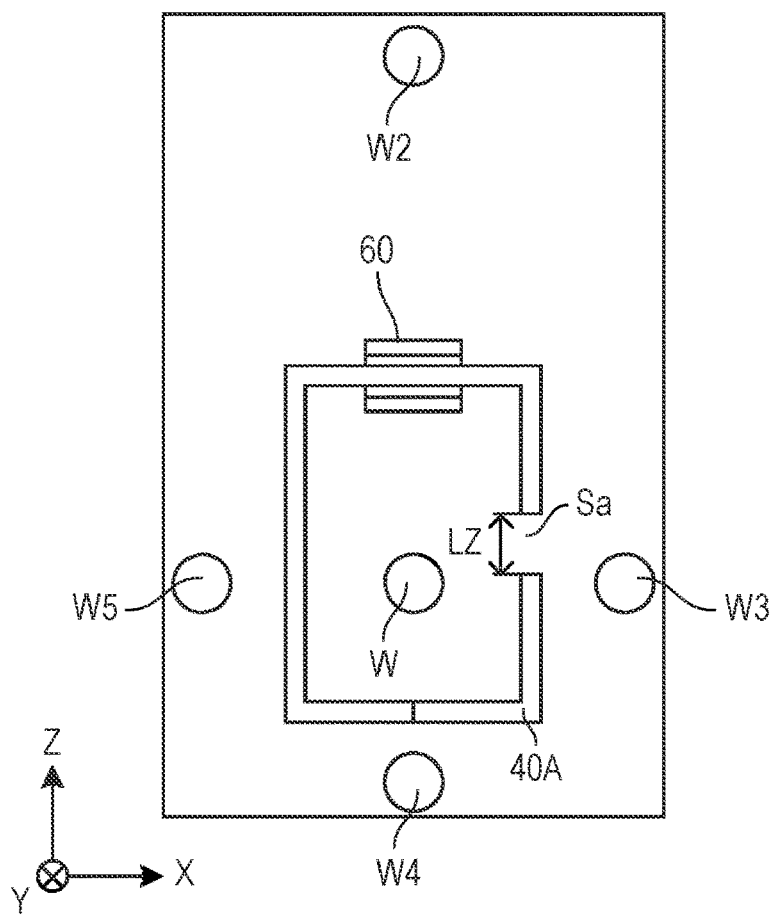
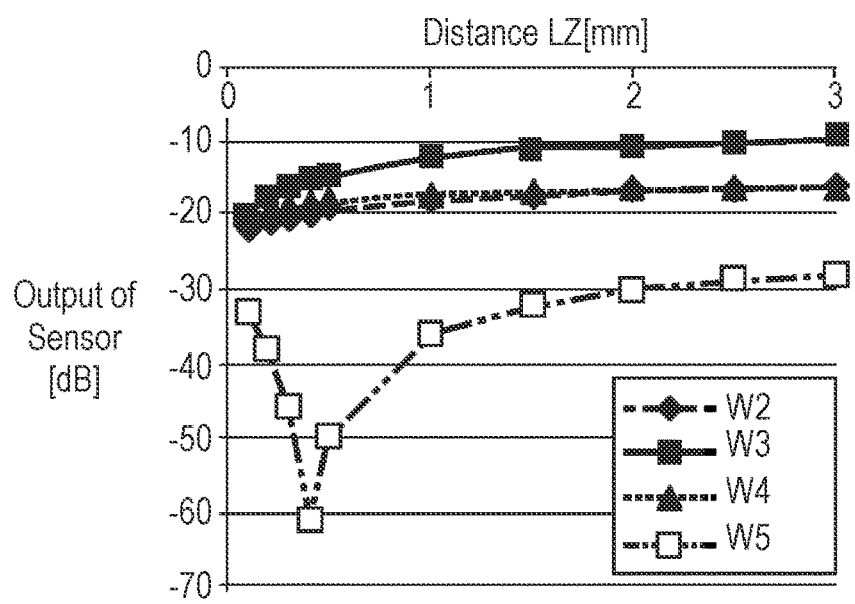

CURRENT SENSOR

CROSS-REFERENCE TO RELATED APPLICATIONS

This application is a U.S. national stage application of the PCT international application No. PCT/JP2020/013546 filed on Mar. 26, 2020, which claims the benefit of foreign priority of Japanese patent application No. 2019-083170 filed on Apr. 24, 2019, the contents all of which are incorporated herein by reference.

TECHNICAL FIELD

The present disclosure relates to a current sensor.

BACKGROUND ART

PTL1 discloses a conventional current sensor in which an electrical conductor is disposed to pass through an annular core on which a coil is partially wound. The annular core of this current sensor is divided in order to facilitate disposing the electrical conductor inside the annular core. In an assembly process, the electrical conductor is first disposed in the divided cores, and then, the cores are assembled such that the electrical conductor passes through the annular core.

CITATION LIST

Patent Literature

PTL1: Japanese Patent Laid-Open Publication No. 9-166625

SUMMARY

A current sensor is configured to detect a current flowing through an electrical conductor. The current sensor includes a core and a coil wound around the core. The core has a hollow configure to allow the electrical conductor to pass through the hollow. The core substantially has a C-shape having a gap connected to the hollow. At least a part of the gap of the core is located inside the coil.

This current sensor suppresses the influence of external noise.

BRIEF DESCRIPTION OF DRAWINGS

FIG. 14A illustrates an influence of an electrical conductor on a core of modified example 1.

DETAILED DESCRIPTION OF PREFERRED EMBODIMENT

Exemplary embodiments described below are examples of the present disclosure. Numerical values, shapes, materials, components, arrangement and connection style of components, processes, sequence of processes, and the like are merely examples and not intended to limit the intention of the present disclosure. Still more, components of the exemplary embodiments that are not described as components in an independent claim indicating an aspect of the present disclosure are described as arbitrary components. Exemplary embodiments of the present disclosure are not limited to the current independent claim, and may be represented by other independent claims.

Exemplary Embodiment

Configuration of Current Sensor

Figure 1:
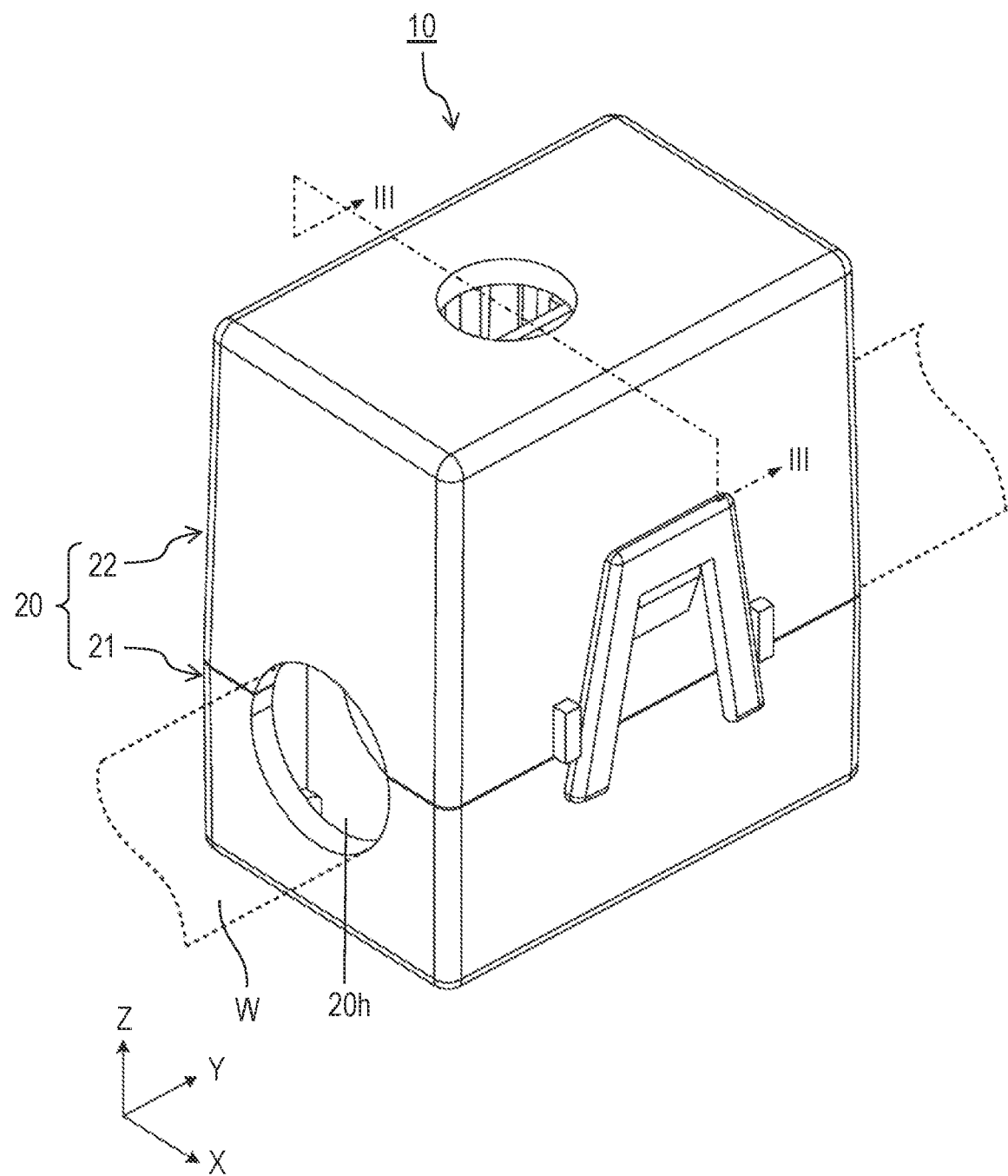
FIG. 1 is a perspective view of a current sensor in accordance with an exemplary embodiment.
Figure 2:
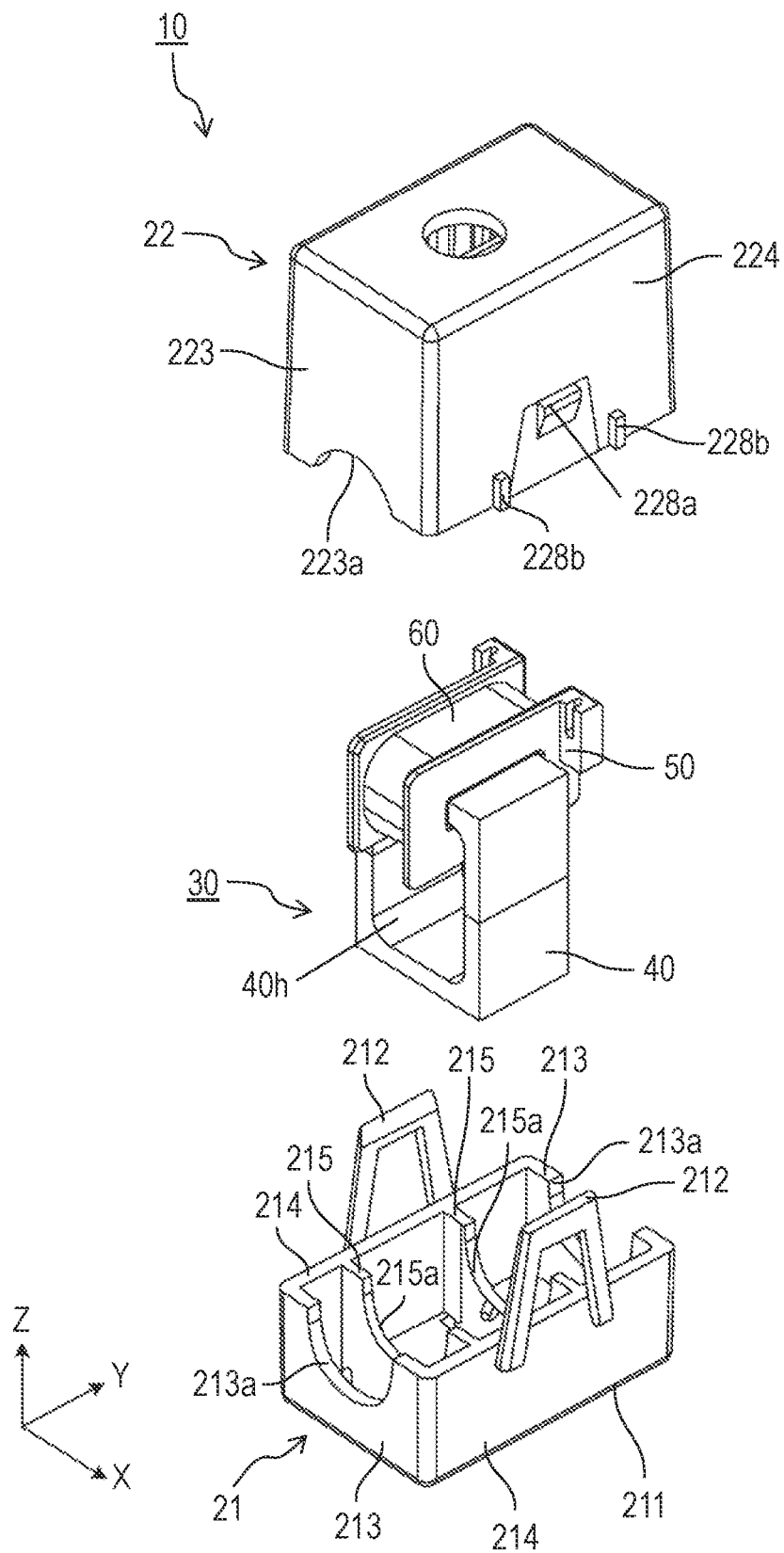
FIG. 2 is an exploded perspective view of the current sensor in accordance with the embodiment.
Figure 3:
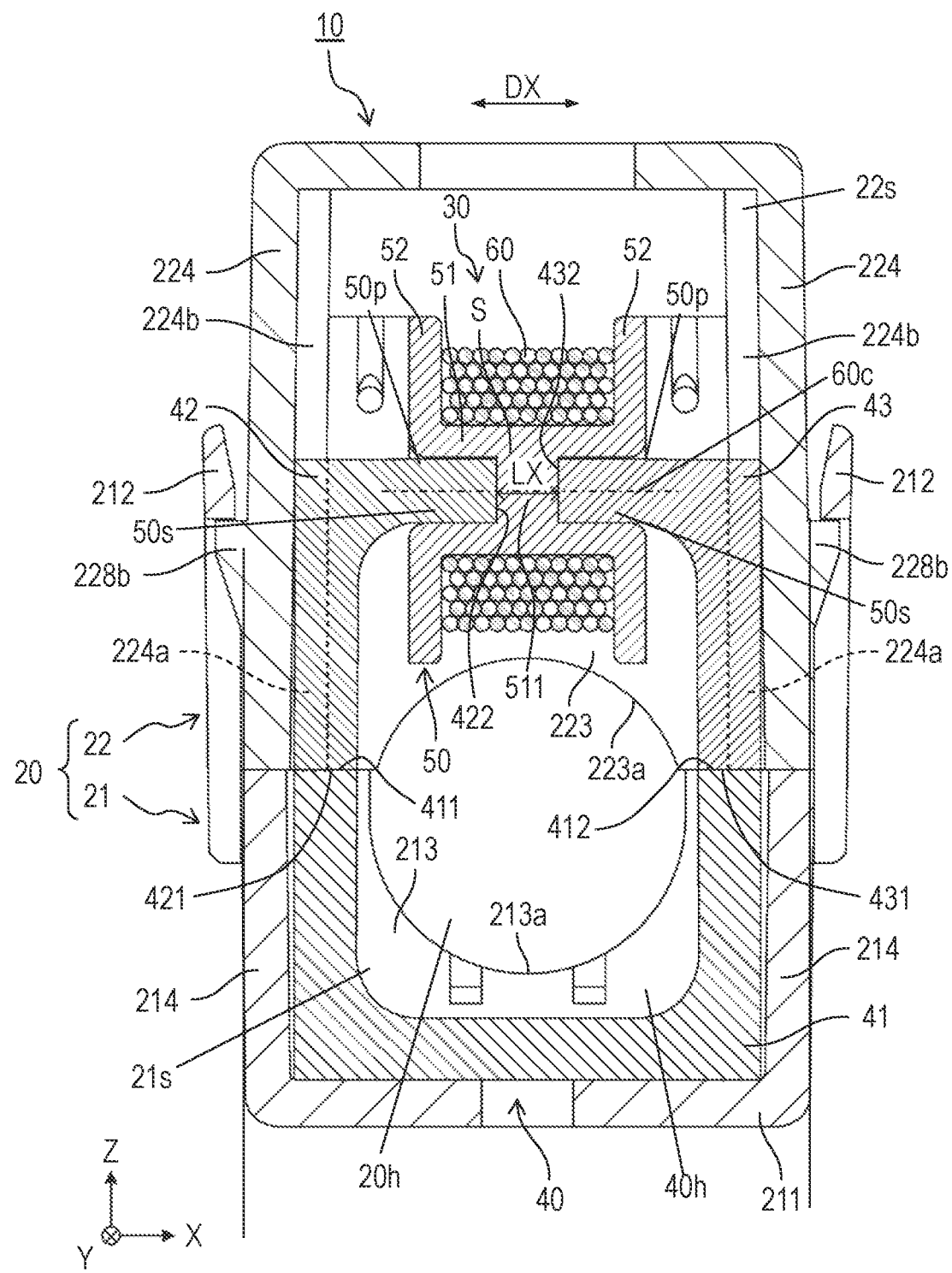
FIG. 3 is a sectional view of the current sensor along line III-III shown in FIG. 1.

FIG. 1 is a perspective view of an outline of current sensor 10 in accordance with an exemplary embodiment. FIG. 2 is an exploded perspective view of current sensor 10. FIG. 3 is a sectional view of current sensor 10 taken along line III-III shown in FIG. 1. In FIG. 1, wire electrical conductor W to be detected is indicated with a broken line. In the following description, an X-axis direction is indicated as width direction X, a Y-axis direction is indicated as thickness direction Y, and a Z-axis direction is indicated as up-down direction Z.

Current sensor 10 is a current transformer (CT) type current sensor configured to detect an alternating-current (AC) current flowing through electrical conductor W. Current sensor 10 includes housing 20 and sensor unit 30 accommodated in housing 20.

Housing 20 is made of, for example, non-magnetic resin, and substantially has a rectangular parallelepiped shape as a whole. Housing 20 has a uniform thickness (a length in the Y-axis direction) as a whole. Housing 20 is divided into cases 21 and 22 in the Z-axis direction. Case 21 is a part of the housing located in a negative direction along of the Z axis while case 22 is a part of the housing located in a positive direction along of the Z axis.

Case 21 includes main body 211 and a pair of locking parts 212 configured to be engaged with case 22. Main body 211 has a box shape having space 21s therein opening in the positive direction along the Z axis. Main body 211 includes a pair of lower walls 213 facing each other in the Y-axis direction, a pair of lower walls 214 facing each other in the X-axis direction, and bottom plate 219. Lower walls 213 and 214 are connected to one another, and extended from bottom plate 219 in the positive direction of the Z axis. Lower walls 213 and 214 and bottom plate 219 surround space 21s. A pair of inner walls 215 parallel to lower walls 213 are provided inside case 21. The pair of inner walls 215 are arranged in the Y-axis direction at a predetermined interval between inner walls 215. A part of sensor unit 30 is fitted in and fixed between the pair of inner walls 215. Cutout 213a having a semicircular shape is provided in each of the pair of lower walls 213. Cutout 215a having a semicircular shape is provided each of the pair of lower walls 215.

The pair of locking parts 212 are extended from an outer surface of the pair of lower walls 214 in the positive direction of Z axis. Each of the pair of locking parts 212 substantially has a U-shape. Case 21 and Case 21 are assembled together and fixed to each other by engaging the pair of locking parts 212 with fitting protrusions 228a and 229b provided on case 22.

Case 22 has a box shape having space 22s therein opening in the negative direction of the Z axis. Case 22 includes a pair of upper walls 223 facing each other in the Y-axis direction, a pair of upper walls 224 facing each other in the X-axis direction, and bottom plate 229. Upper walls 223 and 224 are connected to one another and extended from bottom plate 229 in the negative direction of the Z axis. Upper walls 223 and 224 and bottom plate 229 surround space 22s.

Cutout 223a having a semi-circular shape is provided in each of the pair of upper walls 223. Cutout 223a forms through-hole 20h shown in FIG. 1 together with cutout 213a provided in case 21 while case 21 and case 22 are assembled together. Electrical conductor W is inserted in through-hole 20h. In this state, electrical conductor W is disposed also in cutouts 215a in the pair of inner walls 215. Cutouts 213a, 215a, and 223a functions as supporters supporting electrical conductor W.

A pair of protrusions 224a sandwiching sensor unit 30 in the Y-axis direction are provided on an inner surface of the pair of upper walls 224, respectively. FIG. 3 only shows one of the pair of protrusions 224a located in the positive direction of the Y axis. The pair of protrusions 224a are extended in the Z-axis direction. The pair of protrusions 224a are disposed in the Y-axis direction at a predetermined interval from each other. A part of sensor unit 30 is fitted between the pair of protrusions 224a and fixed onto the pair of protrusions 224a.

Regulating projection 224b that regulates positional deviation of sensor unit 30 in the up-down direction is provided on the inner surface of each of the pair of upper walls 224. Regulating projections 224b are disposed between the pair of protrusions 224a, and extended in the Z-axis direction. A Lower surface of regulating protrusion 224b contacts an upper surface of sensor unit 30 so as to regulate positional deviation of sensor unit 30 in up-down direction Z with respect to housing 20.

Three fitting protrusions 228a and 228b are provided on the outer surface of each of the pair of upper walls 224. Two fitting protrusions 228b among these three fitting protrusions 228a and 228b are provided on a lower end of upper wall 224, and arranged with a predetermined interval from each other in the Y-axis direction. Two fitting protrusions 228b sandwich locking part 212 of case 21 in the Y-axis direction. On the other hand, remaining one fitting protrusion 228a is disposed on an upper center area of two fitting protrusions 228b in the Y-axis direction. Fitting protrusion 228a supports an upper part of locking part 212 of case 21 from below. Three fitting protrusions 228a and 228b engaged with locking part 212 in this state restrict relative positional deviation of case 21 and case 22, and allow case 21 and case 22 to be assembled together and fixed to each other.

Figure 4:
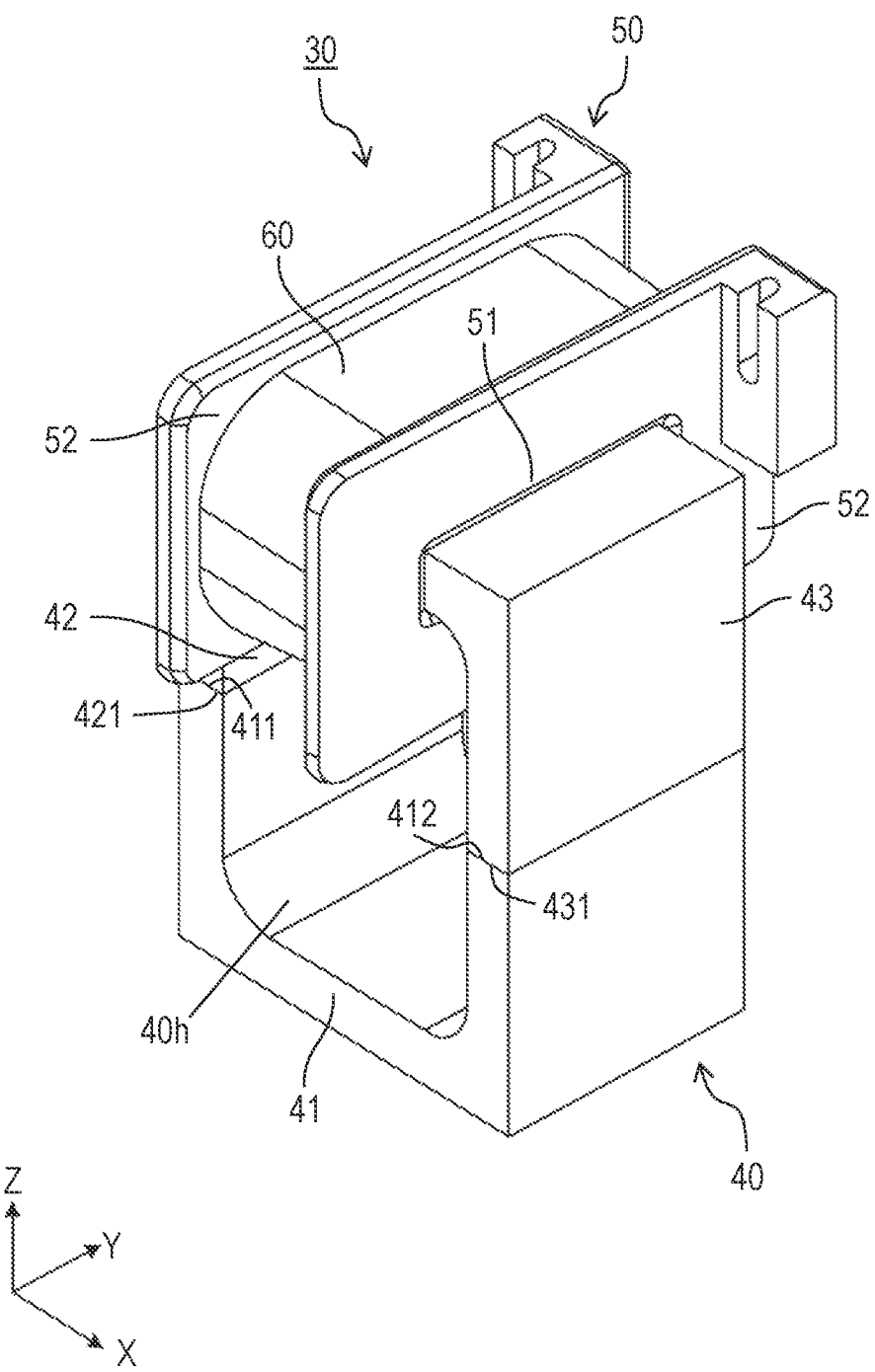
FIG. 4 is a perspective view of a sensor unit of the current sensor in accordance with the embodiment.
Figure 5:
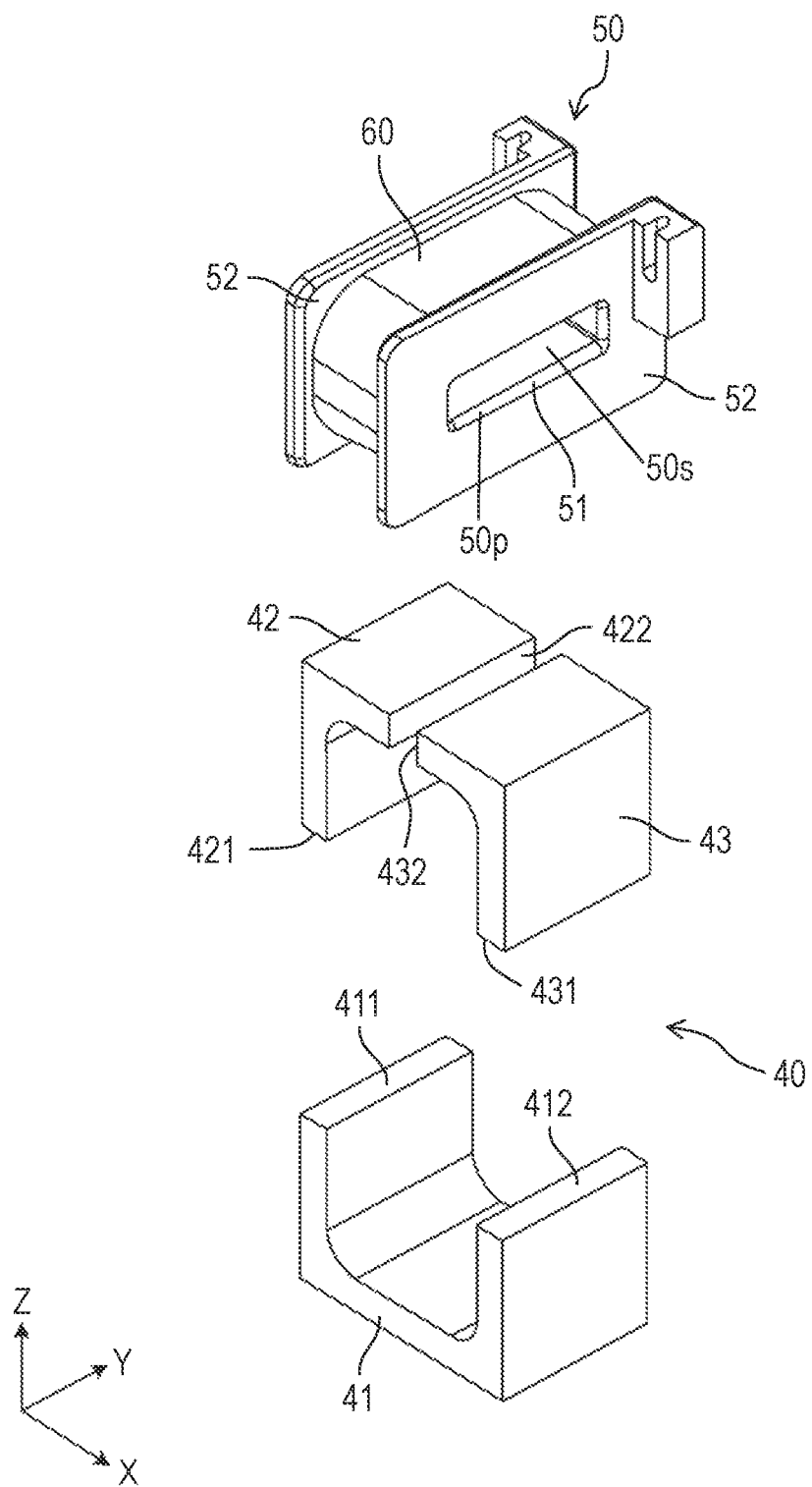
FIG. 5 is an exploded perspective view of the sensor unit in accordance with the embodiment.
Figure 6:
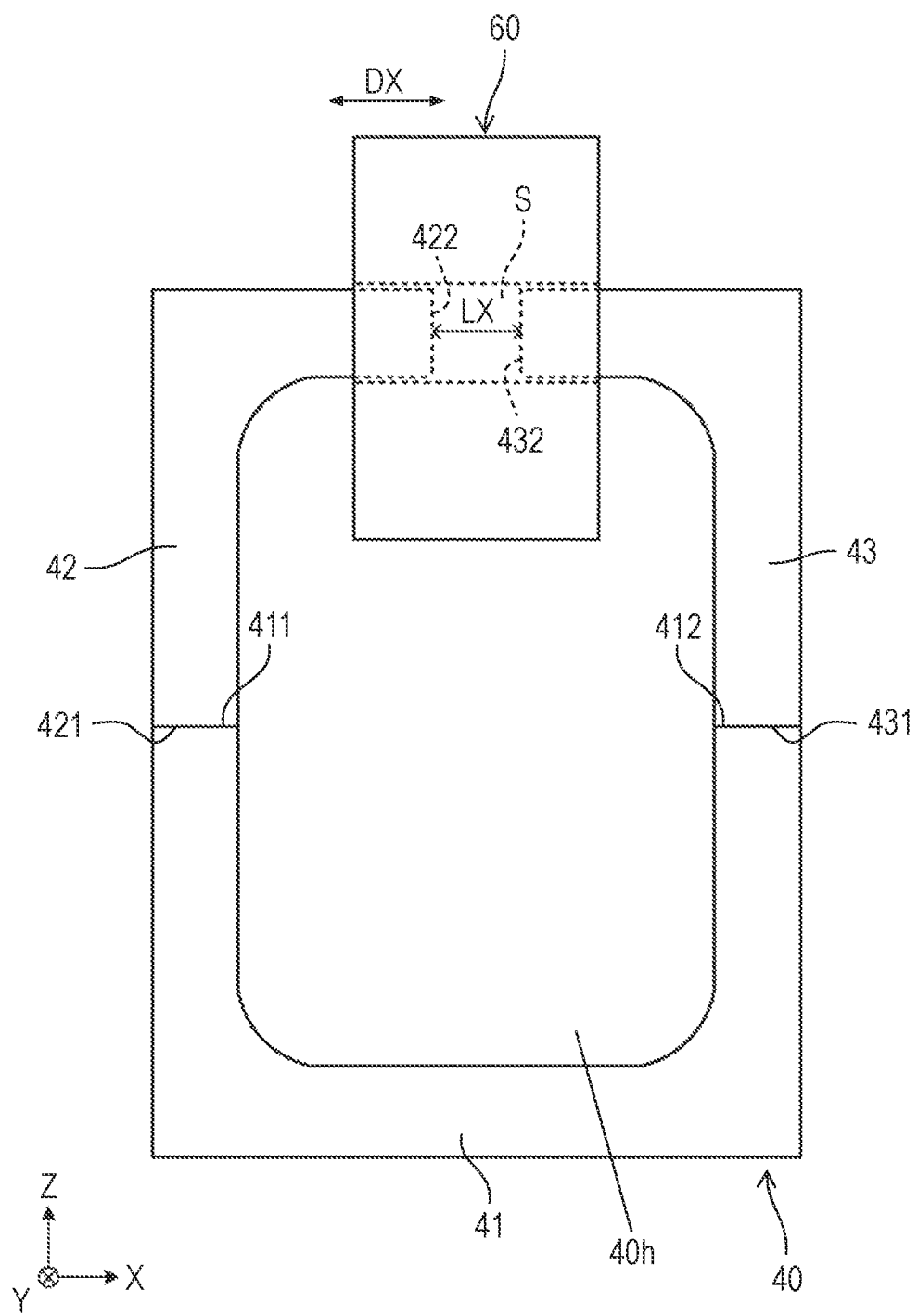
FIG. 6 is a plan view of the sensor unit in accordance with the embodiment.

Sensor unit 30 will be described below. FIG. 4 is a perspective view of sensor unit 30 in accordance with the embodiment. FIG. 5 is an exploded perspective view of sensor unit 30 in accordance with the embodiment. FIG. 6 is a plan view of sensor unit 30 in accordance with the embodiment.

As shown in FIGS. 4 to 6, sensor unit 30 includes core 40, bobbin 50, and coil 60.

Core 40 is made of magnetic material, such as ferrite, and substantially has a C-shape having hollow 40h and gap S connected to hollow 40h. Core 40 has a rectangular frame shape in a plan view. Gap S is provided at the center of an upper frame part of the rectangular frame shape. A cross section of four outer corners of core 40 is a sharp corner, and a cross section of four inner corners is a round corner. However, the cross section of the four outer corners may have an arcuate shape and the cross section of the four inner corners may be sharp. Still more, the outer shape of core 40 is not necessarily the rectangular frame shape. Other polygonal frames, round frames, oval frames, ellipsoidal frames, or the like are applicable.

Core 40 includes split cores 41, 42, and 43 joined to one another. Split core 41 is a lower part of core 40, and split cores 42 and 43 are an upper part of core 40.

Split core 41 substantially has a U-shape with an open top. A pair of end surfaces of split core 41 face upward. These end surfaces are joining surfaces 411 and 412 that are joined with other split cores 42 and 43. The pair of joining surfaces 411 and 412 are planes parallel to an XY plane including the X axis and the Y axis. Joining surface 411 is disposed in the negative direction of the X-axis, and joining surface 412 is disposed in the positive direction of the X axis.

Split core 42 substantially has an L-shape. One end surface of split core 42 is joining surface 421 that is joined with joining surface 411 of split core 41. Joining surface 421 of split core 42 is a plane parallel to the XY plane. Joining surface 421 is joined with joining surface 411 of split core 41 with other end surface 422 of split core 42 directed in the positive direction of the X-axis. Other end surface 422 of split core 42 is a plane parallel to a YZ plane including the Y axis and the Z axis.

Split core 43 substantially has an L-shape. Split core 43 is the same as split core 42. One end surface of split core 43 is joining surface 431 that is joined with joining surface 412 of split core 41. Joining surface 431 of split core 43 is a plane parallel to the XY plane. Joining surface 431 is joined with joining surface 412 of split core 42 with other end surface 432 of split core 43 facing the negative direction of the X axis. Other end surface 432 of split core 43 is a plane surface parallel to the YZ plane.

Each pair of split cores of split cores 41, 42, and 43 adjacent to each other have respective joining surfaces parallel to facing direction DX. Other end surface 422 of split core 42 faces other end surface 432 of split core 43 in facing direction DX parallel to the X axis. Gap S is provided in core 40 between other end surface 422 of split core 42 and other end surface 432 of split core 43. In other words, other end surface 422 of core 42 faces other end surface 432 of split core 43 across gap S in facing direction DX. Distance LX of gap S in facing direction DX (a length in the X-axis direction) is adjusted before assembling current sensor 10 to obtain a desired sensitivity characteristic. As described above, both joining surface 411 of split core 41 and joining surface 412 of split core 42 are planes parallel to the XY plane. Therefore, joining, surfaces 411 and 421 of split cores 41 and 42 slide with respect to each other to move split core 42 and adjust the position of other end surface 422 of split core 42 in the X-axis direction. In other words, distance LX of gap S is adjustable. This configuration also applies to the relationship between joining surface 412 of split core 41 and joining surface 431 of split core 43. In accordance with the embodiment, a desired sensitivity characteristic is obtained by distance LX of gap S in a state that the outer surfaces of the pair of split cores 42 and 43 are flush with the outer surface of split core 41. To achieve the desired sensitivity characteristic, no conductive material is preferably disposed in gap S.

An annular core made of split cores may have a boundary part when assembled. Since this boundary part has a faint gap, the boundary part affects current detection and may reduce the sensitivity.

Current sensor 10 in accordance with the embodiment, as described above, provides a desired sensitivity characteristic.

In accordance with the embodiment, both joining surface 411 of split core 41 and joining surface 421 of split core 42 are planes parallel to the XY plane. However, both joining surface 411 of split core 41 and joining surface 421 of split core 42 may be parallel to the X-axis direction and inclined with respect to the Y-axis direction. In this case, joining surfaces 411 and 421 of split cores 41 and 42 may slide to move split core 42 and adjust the position of other end surface 422 of split core 42 in the X-axis direction. Both joining surface 411 of split core 41 and joining surface 421 of split core 42 may be curved as long as joining surfaces 411 and 421 contact each other with planes.

Bobbin 50 is made of nonmagnetic material, such as resin. Bobbin 50 includes bobbin body 51 having a rectangular tubular shape and a pair of flanges 52 each extended from respective one of both ends of bobbin body 51 in the X-axis direction. Bobbin body 51 is extended in the X-axis direction. Coil 60 is wound on bobbin body 51 about winding axis 60c extended in the X-axis direction. Coil 60 is housed between the pair of flanges 52. A pair of internal spaces 50s are provided along winding axis 60c in bobbin 50, i.e., bobbin body 51.

As shown in FIG. 3, internal bottom part 511 that divides an inside of bobbin body 51 into the pair of internal spaces 50s of bobbin body 51 is provided at the center of an inside of bobbin body 51. The internal spaces 50s open on bobbin body at a pair of openings 50p, respectively. An end part including end surface 422 of split core 42 and an end part including end surface 432 of split core 43 are fitted in the pair of openings 50p while contacting internal bottom part 511 so as to contact bobbin body 51. In other words, bobbin 50 contacts and stops the pair of other end surfaces 422 and 432 of core 40, and surrounds gap S. As a result, internal bottom part 511 regulates gap S between other end surface 422 of split core 42 and other end surface 432 of split core 43. A thickness of internal bottom part 511 (a length in the X-axis direction) is distance LX of gap S. In other words, the thickness of internal bottom part 511 is previously adjusted such that distance LX providing a desired sensitivity characteristic.

Coil 60 is a conductive wire, and is wound around bobbin body 51 with plural turns. As described above, the end part of split core 42 and the end part of split core 43 are press-fitted into the pair of internal spaces 50s of bobbin body 51 so that the pair of other end surfaces 422 and 432 of core 40 are located inside coil 60.

An operation of current sensor 10 will be described below. When magnetic flux is generated inside core 40 by an alternating-current (AC) current flowing through electrical conductor W, an AC current that cancels the magnetic flux flows in coil 60. A measuring instrument is connected to both ends of coil 60 so that the measuring instrument detects and measures the AC current flowing through electrical conductor W according to the AC current flowing in coil 60.

Method of Assembling Current Sensor

A method of assembling current sensor 10 will be described below. Current sensor 10 may be assembled by an operator or an assembly apparatus. Here, assembly by the operator will be described.

First, the operator prepares bobbin 50 by winding coils 60 around bobbin body 51 by a predetermined number of turns. The operator fits the end part of split core 42 and the end part of split core 43 into the pair of openings 50p in bobbin body 51. Here, the operator ensures that end surface 422 of split core 42 and end surface 432 of split core 43 contact internal bottom part 511. This operation allows other end surfaces 422 and 432 face each other across gap S with distance LX.

Then, the operator assembles the pair of split cores 42 and 43 and bobbin 50 with case 22. More specifically, the operator fits the pair of split cores 42 and 43 and bobbin 50 that are assembled together into between the pair of protrusions 224a from beneath case 22. Here, the operator slides the pair of split cores 42 and 43 and bobbin 50 with respect to case 22 until the top end surfaces of the pair of split cores 42 and 43 contact regulating projections 224b of case 22. This operation fixes the pair of split cores 42 and 43 and bobbin 50 inside case 22. Split cores 42 and 43 are fitted into spaces 50s until split cores 42 and 43 contact internal bottom part 511 of bobbin 50 to contact bobbin body 51 in order to be firmly fixed on bobbin 50. Bobbin 50 and split cores 42 and 43 are thus easily fixed onto case 22.

The operator assembles split core 41 to case 21. More specifically, the operator fits split core 41 into between the pair of inner walls 215 from above case 21. Here, the operator slides split core 41 with respect to case 21 until the bottom end surface of split core 41 contacts an internal bottom of case 21. This will fix split core 41 inside case 21.

Next, the operator assembles electrical conductor W to case 21 and split core 41. The operator allows electrical conductor W to be accommodated in cutouts 213a and 215a of case 21. Electrical conductor W is supported by cutouts 213a and 215a, and is disposed on the open end side of split core 41.

Next, the operator assembles case 22 to case 21 supporting electrical conductor W. In the assembling, the operator engages fitting protrusions 228a and 228b provided on upper walls 224 of case 22 with locking part 212 of case 21, thus assembling case 21 and case 22. Joining surface 411 of split core 41 is joined with joining surface 421 of split core 42, and joining surface 412 of split core 41 is joined with joining surface 431 of split core 43 inside case 21 and case 22, thereby providing current sensor 10.

When positions of cases 21 and 22 are relatively deviated due to a mechanical impact, such as dropping and transfer, applied to current sensor 10, split cores 41, 42, and 43 may crack and chip at joining surfaces 411 and 412 of split core 41 and joining surfaces 421 and 431 of split cores 42 and 43 that contact each other but are not bonded to each other. In current sensor 10, as described above, three fitting protrusions 228a and 228h are engaged with locking part 212 to restrict relative positional deviation of case 21 and case 22 and fix cases 21 and 22 to each other while being assembled. As a result, relative deviation of split cores 41, 42, and 43 is prevented to avoid chipping of split cores 41, 42, and 43.

In accordance with the embodiment, the joining surfaces are simply contact each other to join without bonding the joining surfaces. However, the joining surfaces may be bonded to each other with magnetic adhesive, or the joining surfaces may be welded to each other. Even after bonding or welding, the joining surfaces before bonding or welding can be identified by analyzing a bonding mark or a welding mark. When joining surfaces simply contact each other, the core may be easily disassembled by separating split cores. Therefore, operability during maintenance, for example, can be increased.

Effects

As described above, current sensor 10 in accordance with the embodiment includes core 40 through which electrical conductor W passes, and coil 60 wound on core 40. Split cores 41, 42, and 43 are joined to one another so as to constitute to form core 40. Core 40 substantially has the C-shape partially provided with gap S therein. The pairs of joining surfaces 411, 412, 421, and 431 of cores 41, 42, and 43 (specifically, the pair of joining surface 411 and joining surface 421, and the pair of joining surface 412 and joining surface 431) are parallel to facing direction DX of other end surfaces 422 and 432, which are the pair of end surfaces of core 40 forming gap S.

Figure 7:
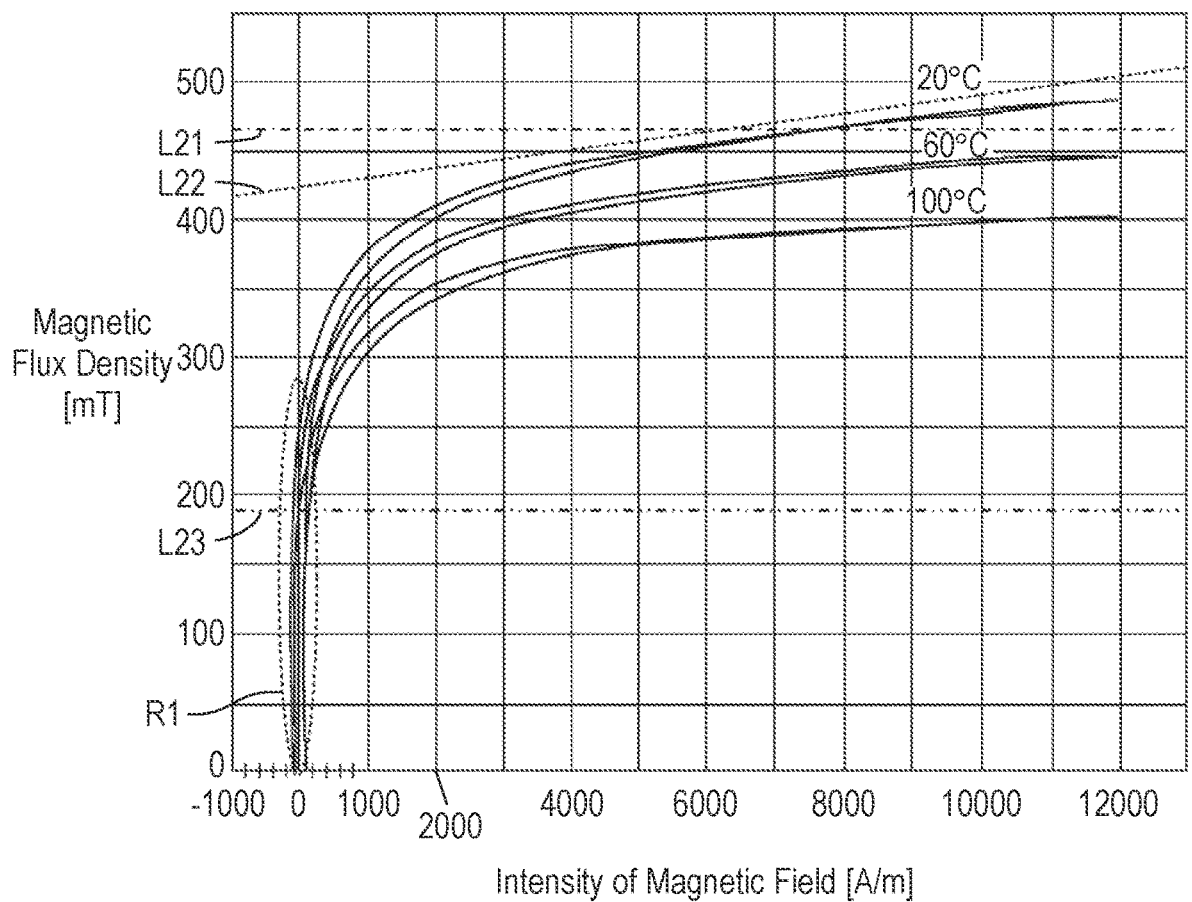
FIG. 7 illustrates a BH curve of ferrite which is material of a core in accordance with the embodiment.

As a result of studies, the inventors of the present disclosure have found that the boundary part may be ignored by providing, in a part of core 40, gap S extremely larger than boundary parts of split cores 41, 42, and 43. FIG. 7 is a graph showing a BH curve of ferrite, a material of core 40 in accordance with the embodiment.

A core without gap S is prepared as a comparative example. The core of the comparative example has a configuration same as core 40 in accordance with the embodiment except that the comparative example does not have gap S. A magnetic flux density of the core of the comparative example is value L21 ranging from 455 mT to 465 mT. In this range, a BK curve changes in a curve, and inclination of tangent L22 of the BH curve is small. Therefore, magnetic saturation of the core in the comparative example may occur at the magnetic flux density of about 0.5 T.

On the other hand, a magnetic flux density of core 40 having gap S in accordance with the embodiment is value L23 ranging from 180 mT to 190 mT. Therefore, the BH curve is linear, and the magnetic flux density changes in region R1 that has large inclination. As a result, core 40 suppresses magnetic saturation.

Figure 8:
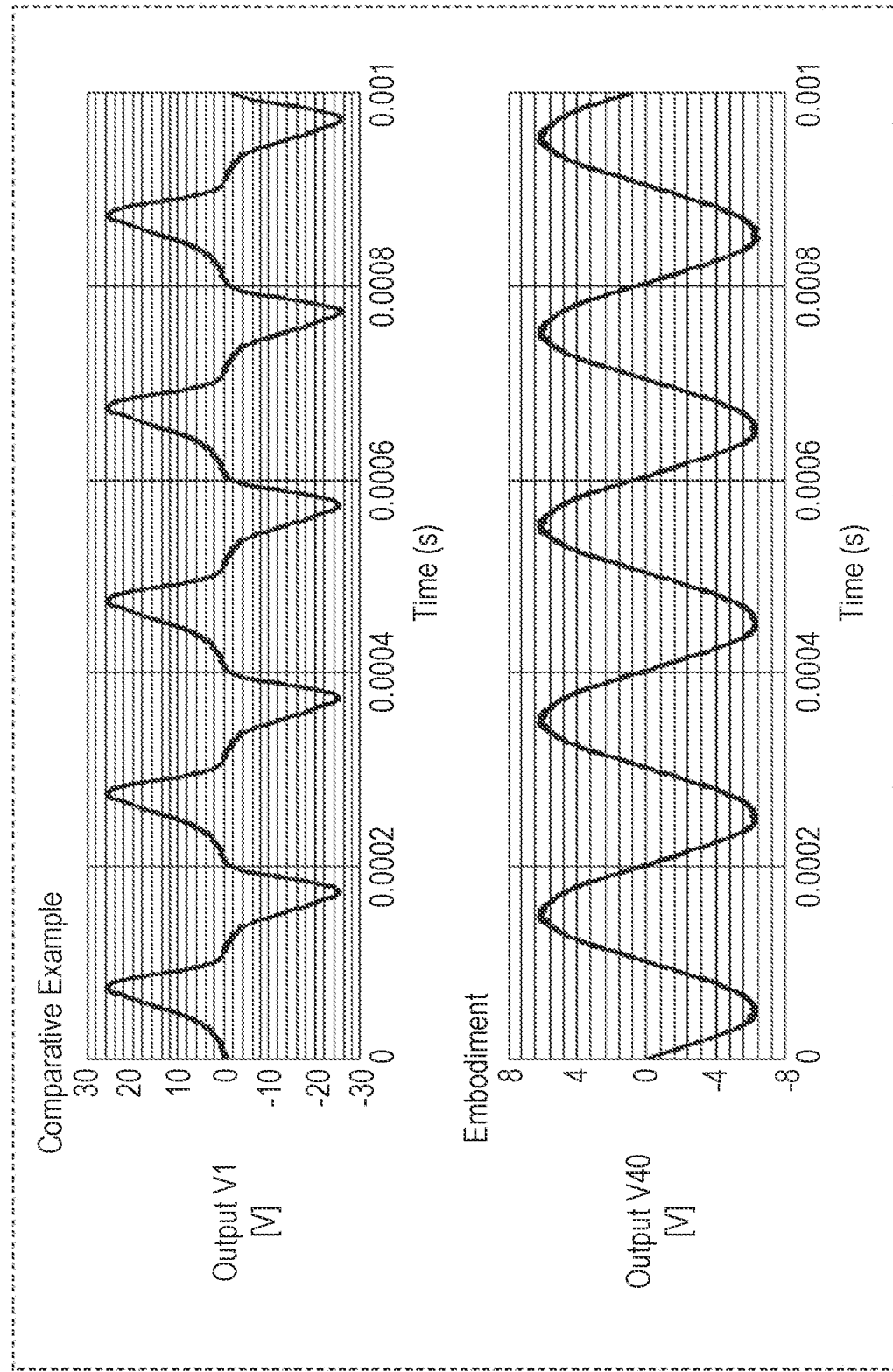
FIG. 8 illustrates comparison of output waveforms between the core in accordance with the embodiment and a core of a comparative example.

FIG. 8 shows comparison between output V40 of core 40 in accordance with the embodiment and output V1 of the core of the comparative example. Waveforms of outputs V40 and V1 are generated when a sinusoidal current with amplitude of 15 A and a frequency of 5 kHz is applied to electrical conductor W. As shown in FIG. 8, the waveform of the output of the core of the comparative example is significantly distorted at the peak. This is due to occurrence of magnetic saturation. On the other hand, the waveform of output V40 of core 40 in accordance with the embodiment is not distorted at the peak. This means that magnetic saturation is suppressed in core 40 in accordance with the embodiment, compared with the core of the comparative example.

In current sensor 10 in accordance with the embodiment, the pairs of joining surfaces 411, 412, 421, and 431 of split cores 41, 42, and 43 forming core 40 are parallel to facing direction DX in which the pair of other end surfaces 422 and 432 face each other and forming gap S of core 40. This configuration allows distance LX of gap S to be adjusted in facing direction DX by sliding the pairs of joining surfaces 411, 412, 421, and 431 of split cores 41, 42, and 43 with respect to one another.

Figure 9:
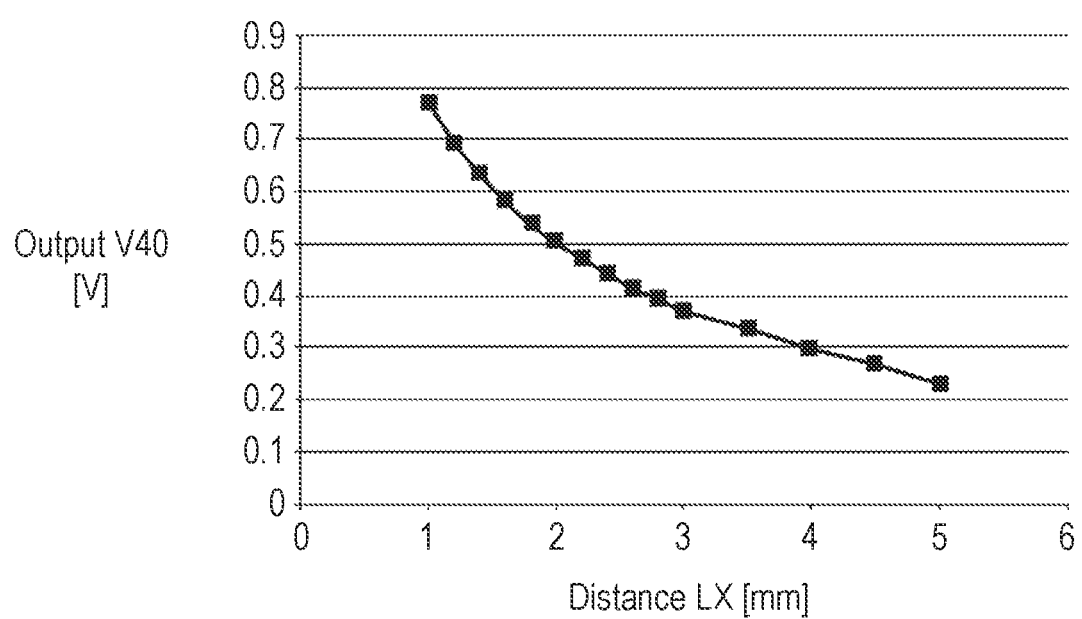
FIG. 9 illustrates a relationship of a gap of a core and an output of the current sensor in accordance with the embodiment.

FIG. 9 is a graph showing a relationship of gap S of core 40 and output V40 of current sensor 10 in accordance with the embodiment. As shown in FIG. 9, as distance LX of gap S increases, sensitivity tends to decrease. However, a decrease of sensitivity saturates after the distance exceeds a certain length. In other words, the desired sensitivity characteristic can be obtained just by adjusting distance LX of gap S without being affected by a faint gap in the boundary parts of split cores 41, 42, and 43.

The above shows that the desired sensitivity characteristic can be achieved even when the boundary part exists in core 40 in current sensor 10 in accordance with the embodiment.

Various sensitivity characteristics can be achieved by adjusting distance LX of gap S although the same type of core is used. Accordingly, a common component may be applied to other types of current sensor.

Figure 10A:
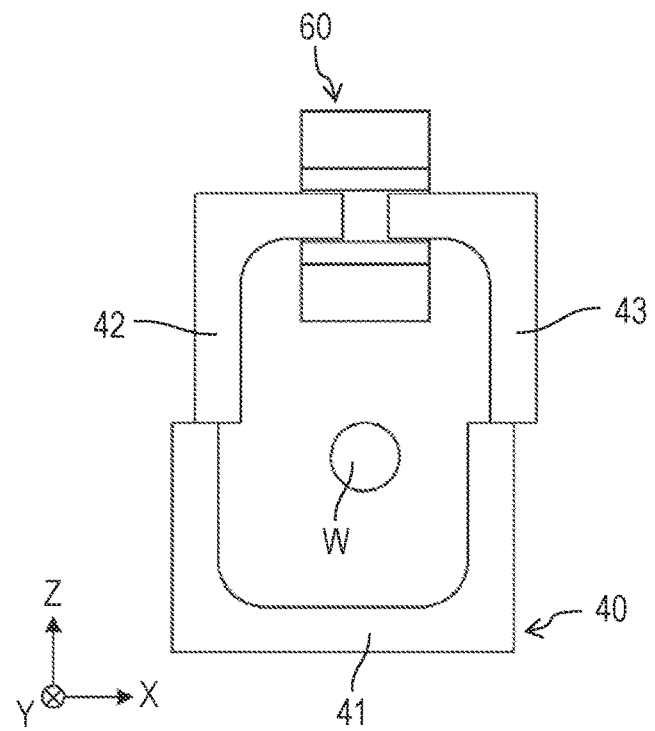
FIG. 10A is a front view of another core in accordance with the embodiment.
Figure 10B:
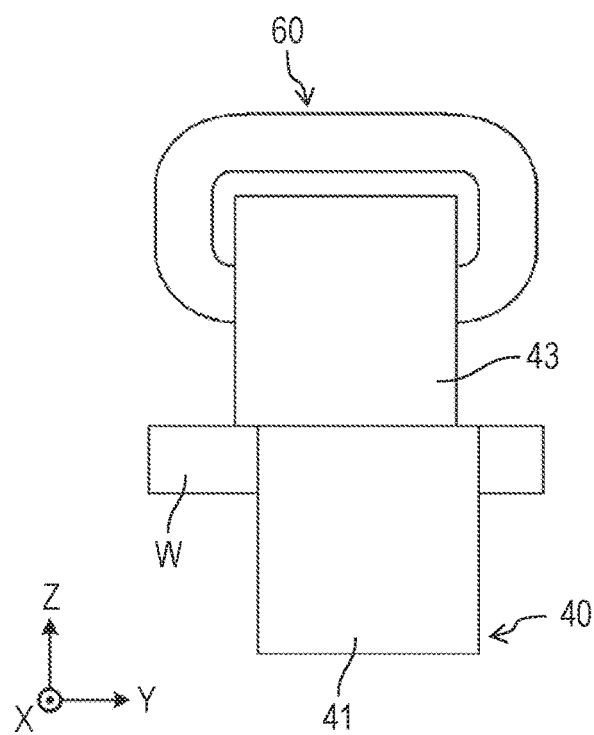
FIG. 10B is a side view of the core shown in FIG. 10A.
Figure 11:
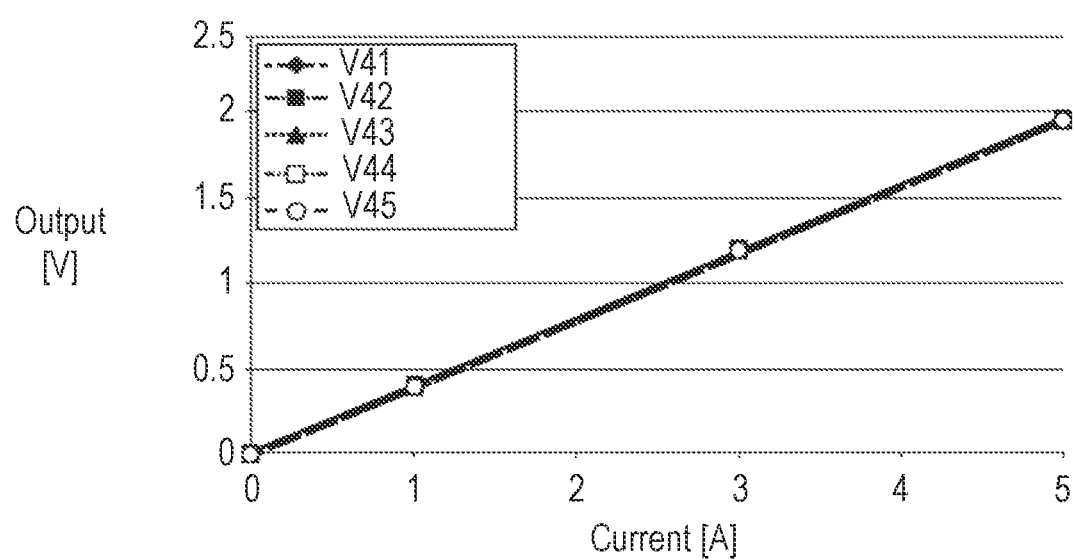
FIG. 11 illustrates a current and an output with respect to the core in accordance with the embodiment.

Adjustment of gap S may result in deviated arrangement with a level difference of at least split core 42 or split core 43 with respect to split core 41. FIG. 10A and FIG. 10B show the state of arrangement with a level difference between at least split core 42 or split core 43 and split core 41 in accordance with the embodiment. Specifically, in FIG. 10A, both split core 42 and split core 43 are deviated in width direction X with respect to split core 41. In FIG. 10B, both split core 42 and split core 43 are deviated in thickness direction Y with respect to split core 41. The inventor has changed a degree of deviation of split core 42 and split core 43 with respect to split core 41, and obtained a current-output line for each deviation. FIG. 11 shows the current-output line for each degree of deviation of core 40 in accordance with the embodiment. Output V41 is obtained under the condition that core 40 is not deviated. Output V42 is obtained under the condition that both split core 42 and split core 43 are deviated with respect to split core 41 by 0.5 mm in width direction X, and output V43 is obtained under the condition of the deviation by 1.0 mm in width direction X. FIG. 11 also shows output V44 obtained under the condition that both split core 42 and split core 43 are deviated with respect to split core 41 by 0.5 mm in thickness direction Y and output V45 obtained under the condition of the deviation by 1.0 mm in thickness direction Y. As shown in FIG. 11, the current-output lines are almost the same in all of these conditions. In other words, there is no influence on the sensitivity characteristic of current sensor 10 even when at least split core 42 or split core 43 is deviated with a level difference in arrangement with split core 41 due to adjustment of gap S.

Distance LX of gap S may also be determined with reference to parameters of core 40. Parameters for determining distance LX of gap S are, for example, the number of turns of electrical conductor W, a cross-sectional area of electrical conductor W, a shape of core 40, a distance from electrical conductor W to core 40, and a material of core 40. The material of core 40 other than ferrite may be, e.g., Ni—Zn based material, Mn—Zn based material, or iron based material.

The number of split cores 41, 42, and 43 is three or more, and the pairs of joining surfaces 411, 412, 421, and 431 of each pair of split cores are parallel to facing direction DX.

Three or more split cores 41, 42, and 43 allow the inside of C-shaped core 40 to widely open during assembly, and facilitate electrical conductor W be disposed inside C-shaped core 40.

The pairs of joining surfaces 411, 412, 421, and 431 of each pair of split cores (the pair of split core 41 and split core 42 and the pair of split core 41 and split core 43) are parallel to facing direction DX. This configuration allows distance LX of gap S to be adjusted just by sliding each of the pairs of joining surfaces 411, 412, 421, and 431 of the pairs of split cores.

Current sensor 10 includes non-magnetic bobbin 50 having coil 60 wound thereon. Bobbin 50 contacts and stops the pair of end surfaces (other end surfaces 422 and 432) of core 40, and surrounds gap S.

Non-magnetic bobbin 50 having coil 60 wound thereon contacts and stops the pair of end surfaces of core 40. This configuration allows gap S after adjustment to be stably retained. This configuration may eliminate a dedicated component for retaining distance LX of gap S, accordingly suppressing an increase of the number of components. In addition, bobbin 50 made of a non-magnetic body does not affect current detection.

When coil 60 is directly wound on core 40 to surround gap S, a winding work is difficult due to gap S. However, coil 60 is wound on non-magnetic bobbin 50 and bobbin 50 surrounds gap S to enhance the efficiency of work.

Current sensor 10 includes case 21 accommodating split core 41, which is one split core of plural split cores 41, 42, and 43, and case 22 accommodating split cores 42 and 43, which are one or more other split cores of the plural split cores 41, 42, and 43. Case 21 and case 22 are assembled together, and one split core 41 is fixed onto other split cores 42 and 43.

As a result, positions of the plurality of split cores 41, 42, and 43 inside case 21 and case 22 are unlikely deviated from each other after assembling. Accordingly, distance LX of gap S in core 40 is stabilized for a long period of time to retain the sensitivity characteristic of current sensor 10 for a long period of time.

The plural split cores 41, 42, and 43 are joined to form core 40.

By assembling the plurality of split cores 41, 42, and 43 to surround electrical conductor W and form core 40, electrical conductor W can be easily disposed inside to pass through C-shaped core 40.

MODIFIED EXAMPLES

The configuration of the core is not limited to that described in the above exemplary embodiment. Modified examples of the core will be described below centering on a difference with the above exemplary embodiment. In the following description, components same as those of the above exemplary embodiment will be given the same reference marks, and the description thereof may be omitted.

Modified Example 1

Figure 12:
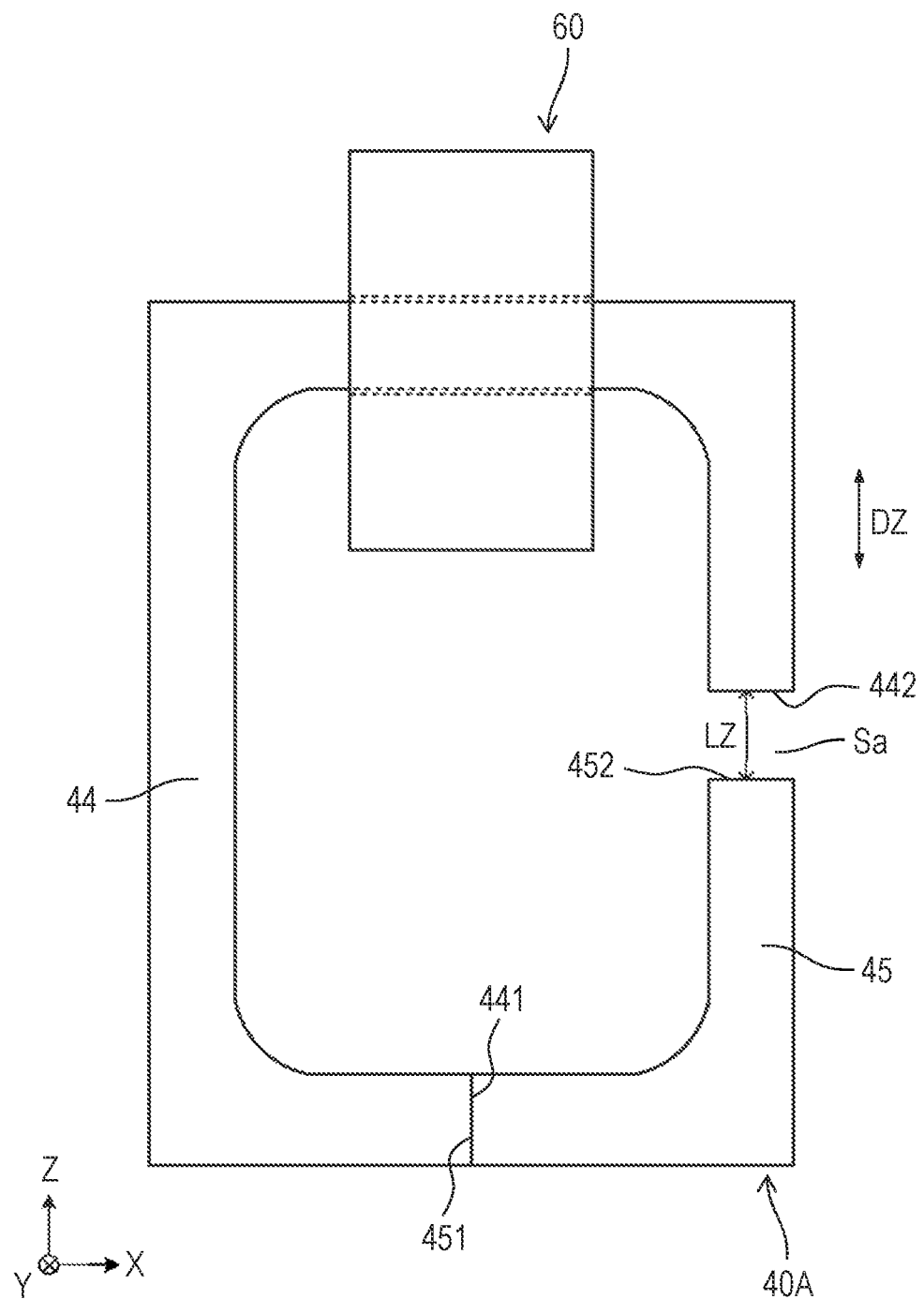
FIG. 12 is a plan view of still another core in accordance with the embodiment.

In the above embodiment, current sensor 10 includes core 40 composed of three split cores 41, 42, and 43. A current sensor of modified example 1 includes core 40A composed of two split cores 44 and 45. FIG. 12 is a plan view of core 40A of modified example 1. FIG. 12 corresponds to FIG. 6.

As shown in FIG. 12, core 40A is composed of two split cores 44 and 45. Split core 44 has gap Sa therein at a lower part of the rectangular frame shape in the positive direction of the X axis. One end surface 441 out of a pair of end surfaces 441 and 442 of split core 44 directed in the positive direction of the X axis, and another end surface 442 out of the pair of end surfaces 441 and 442 of split core 44 directed downward, i.e., in the negative direction of the Z-axis. One end surface 441 is a plane parallel to the YZ plane. Another end surface 442 is a plane parallel to the XY plane. One end surface 441 is a joining surface to be joined with other split core 45.

Split core 45 substantially has an L-shape. One end surface 451 of split core 45 is a joining surface to be joined with end surface 441 of split core 44. One end surface 451 of split core 45 is a plane parallel to the YZ plane. One end surface 451 is joined with tip surface 441 of split core 44 while another end surface 452 of split core 45 is directed upward. Other end surface 452 of split core 45 is a plane parallel to the XY plane.

Gap Sa is provided between end surface 442 of split core 44 and another end surface 452 of split core 45. A pair of end surfaces (end surface 442 and another end surface 452) that form gap Sa face each other across gap Sa in facing direction DZ of the Z axis. Distance LZ (a length in the Z-axis direction) of gap Sa is adjusted before assembly to achieve a desired sensitivity characteristic. As described above, both end surface 441 of split core 44 and one end surface 451 of split core 45 are planes parallel to the YZ plane. Therefore, the joining surfaces (end surface 441 and one end surface 451) of split cores 44 and 45 are slidable with respect to each other to move split core 45 and adjust the position of another end surface 452 of split core 45 in the Z-axis direction. As a result, distance LZ of gap Sa can be adjusted.

In core 40A of modified example 1, coil 60 is wound around an upper part of split core 44. Coil 60 may be directly wound around the upper part of split core 44 or wound indirectly via the bobbin around the upper part of split core 44.

Modified Example 2

Figure 13:
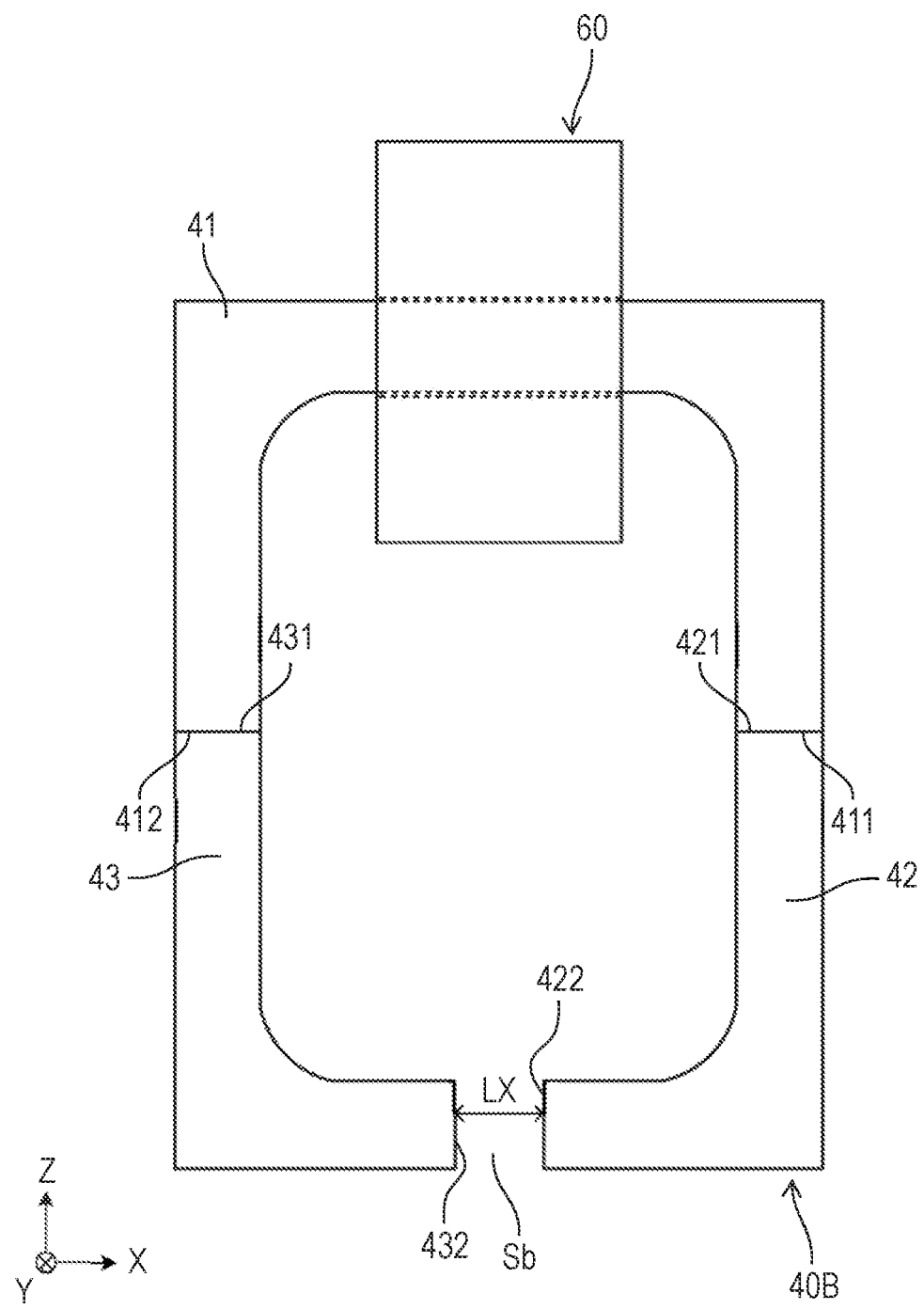
FIG. 13 is a plan view of a further core in accordance with the embodiment.

In the above embodiment, current sensor 10 includes core 40 with gap S provided at the center of the upper frame part of the frame shape. A current sensor of modified example 2 includes core 40B with gap Sb at the center of a lower frame part of the frame shape. FIG. 13 is a plan view of core 40B of modified example 2. FIG. 13 corresponds to FIG. 6.

Core 40B substantially has a C-shape having gap Sb therein at the center of the lower frame part of the rectangular frame shape in the plan view. Core 40B has a configuration of core 40 with id reversed up and down, and its structure is equivalent to core 40. In core 40B of modified example 2, coil 60 is wound on an upper part of split core 41. Coil 60 may be directly wound on the upper part of split core 41 or wound indirectly via the bobbin around the upper part of split core 41.

Position of Coil

In current sensor 10, another electrical conductor different from electrical conductor W may be disposed outside core 40. This electrical conductor may degrade accuracy of detection of a current in electrical conductor W. However, by disposing coil 60 at an appropriate position with respect to core 40, an influence of other electrical conductor can be suppressed to enhance accuracy of current detection of electrical conductor W.

Figure 14B:
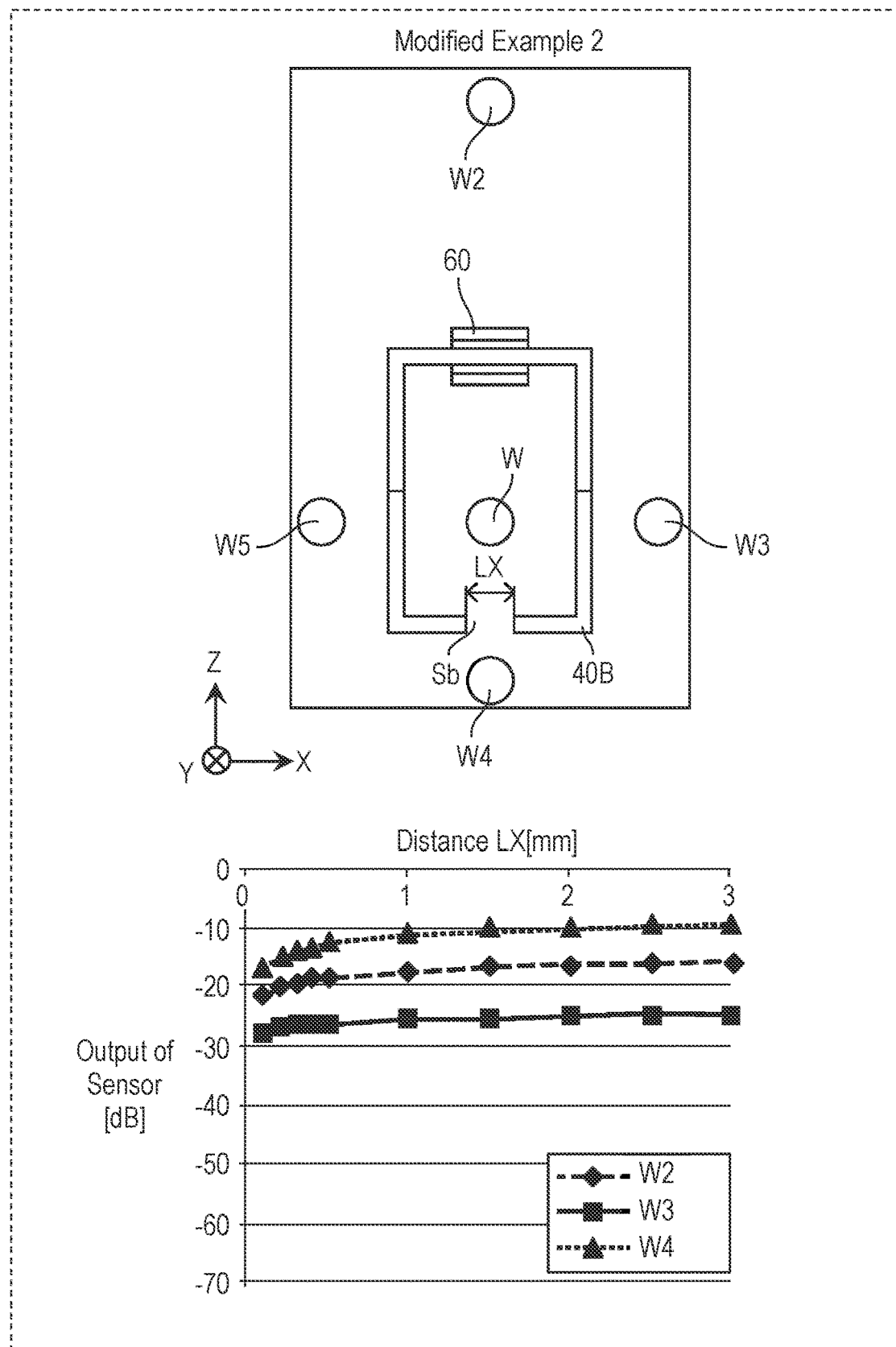
FIG. 14B illustrates an influence of an electrical conductor on a core of modified example 2.
Figure 14C:
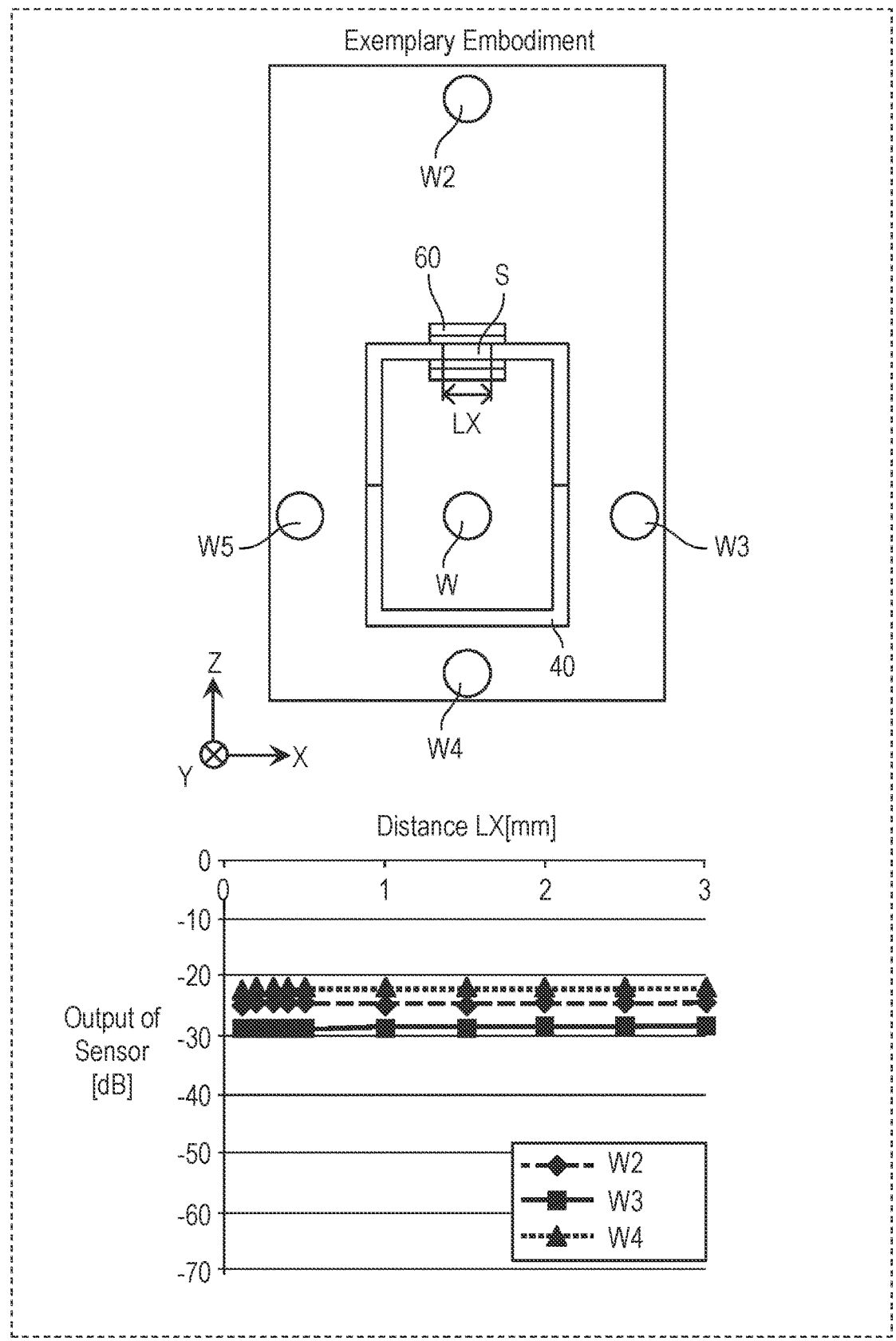
FIG. 14C illustrates an influence of an electrical conductor on the core in accordance with the embodiment.

FIG. 14A illustrates an influence of other electrical conductors W2, W3, W4, and W5 on core 40A of modified example 1. FIG. 14B illustrates an influence of other electrical conductors W2, W3, W4, and W5 on core 40B of modified example 2. FIG. 14C illustrates an influence of other electrical conductors W2, W3, W4, and W5 on core 40 in accordance with the embodiment. As shown in FIGS. 14A to 14C, other electrical conductor W2 is disposed above cores 40, 40A, and 40B. Other electrical conductor W3 is disposed in the positive direction of the X axis of cores 40, 40A, and 40B. Other electrical conductor W4 is disposed below cores 40, 40A, and 40B. Other electrical conductor W5 is disposed in the negative direction of the X axis of cores 40 40A, and 40B.

Each graph in FIGS. 14A to 14C shows an influence of other electrical conductors W2 to W5 on detection of current flowing through electrical conductor W when gaps S, Sa, and Sb are changed from 0 mm to 3 mm. An influence of other electrical conductor W5 is equivalent to other electrical conductor W3 of modified example 2 and the embodiment, and thus electrical conductor W5 is omitted. A sensor output of −20 dB or greater indicates that other electrical conductor has a significant influence.

In modified example 1, electrical conductors W2 to W4 other than electrical conductor W5 provide values greater than −20 dB. It is apparent that a current detection of electrical conductor W is affected. In modified example 2, electrical conductors W2 and W4 other than electrical conductor W3 provide values greater than −20 dB. It is apparent that a current detection of electrical conductor W is affected. These influences occur due to entry of magnetic flux from external electrical conductors W2 to W5 through spaces Sa and Sb.

On the other hand, in accordance with the embodiment, the output is −20 dB or less in all of other electrical conductors W2 to W4. Fluctuation is also small. This is because coil 60 is wound at a position surrounding gap S in core 40, and coil 60 blocks the magnetic flux from external electrical conductors W2 to W5 toward gap S. The influence of the magnetic flux can thus be suppressed. In other words, core 40 in accordance with the embodiment is preferable from the view of suppressing the influence of other electrical conductors W2 to W5.

An influence of other electrical conductors W2, W3, W4, and W5 when coil 60 is disposed at different positions in cores 40, 40A, and 40B of modified examples 1 and 2 will be described below.

Figure 15:
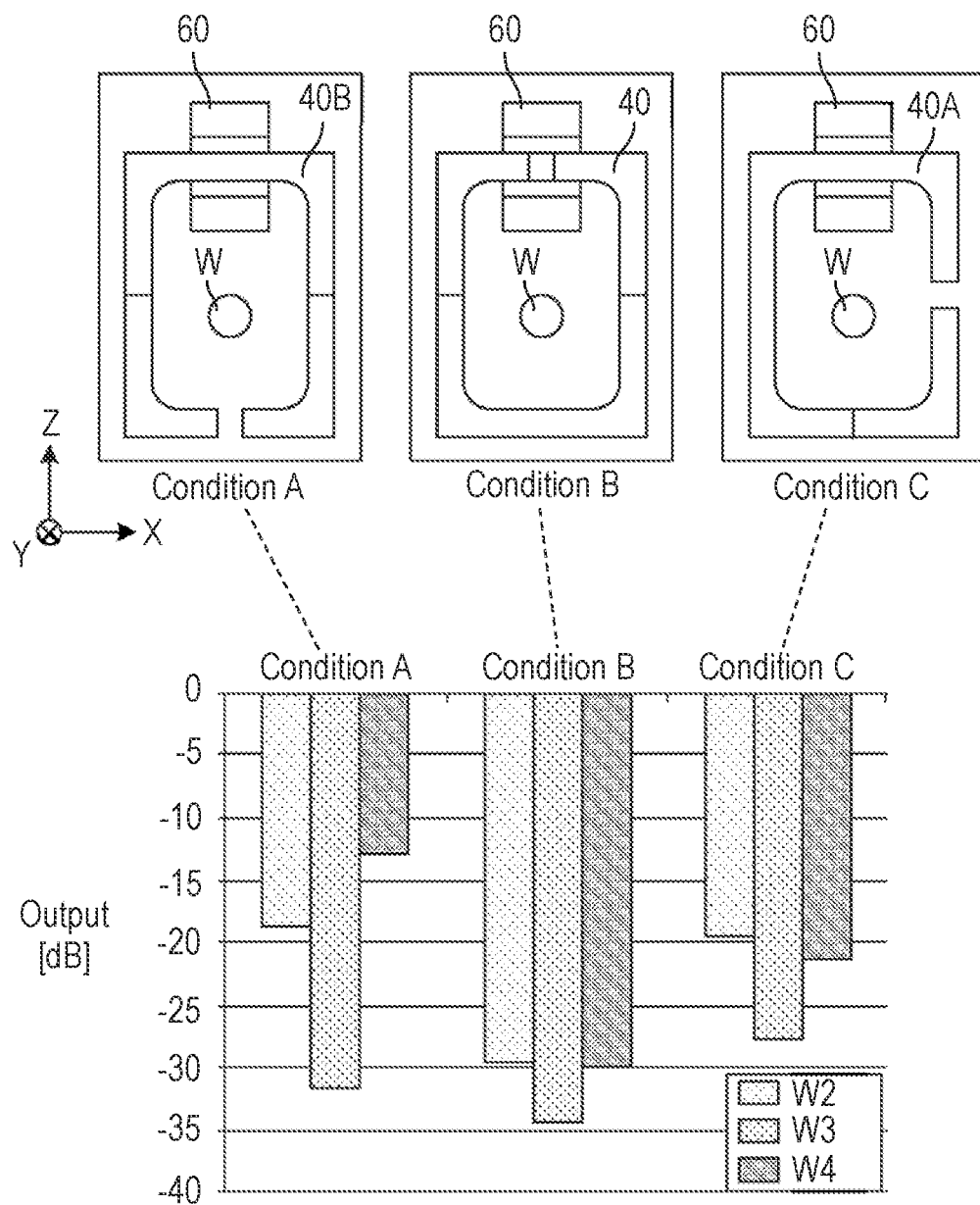
FIG. 15 illustrates the core and an output of the current sensor in accordance with the embodiment.
Figure 16:
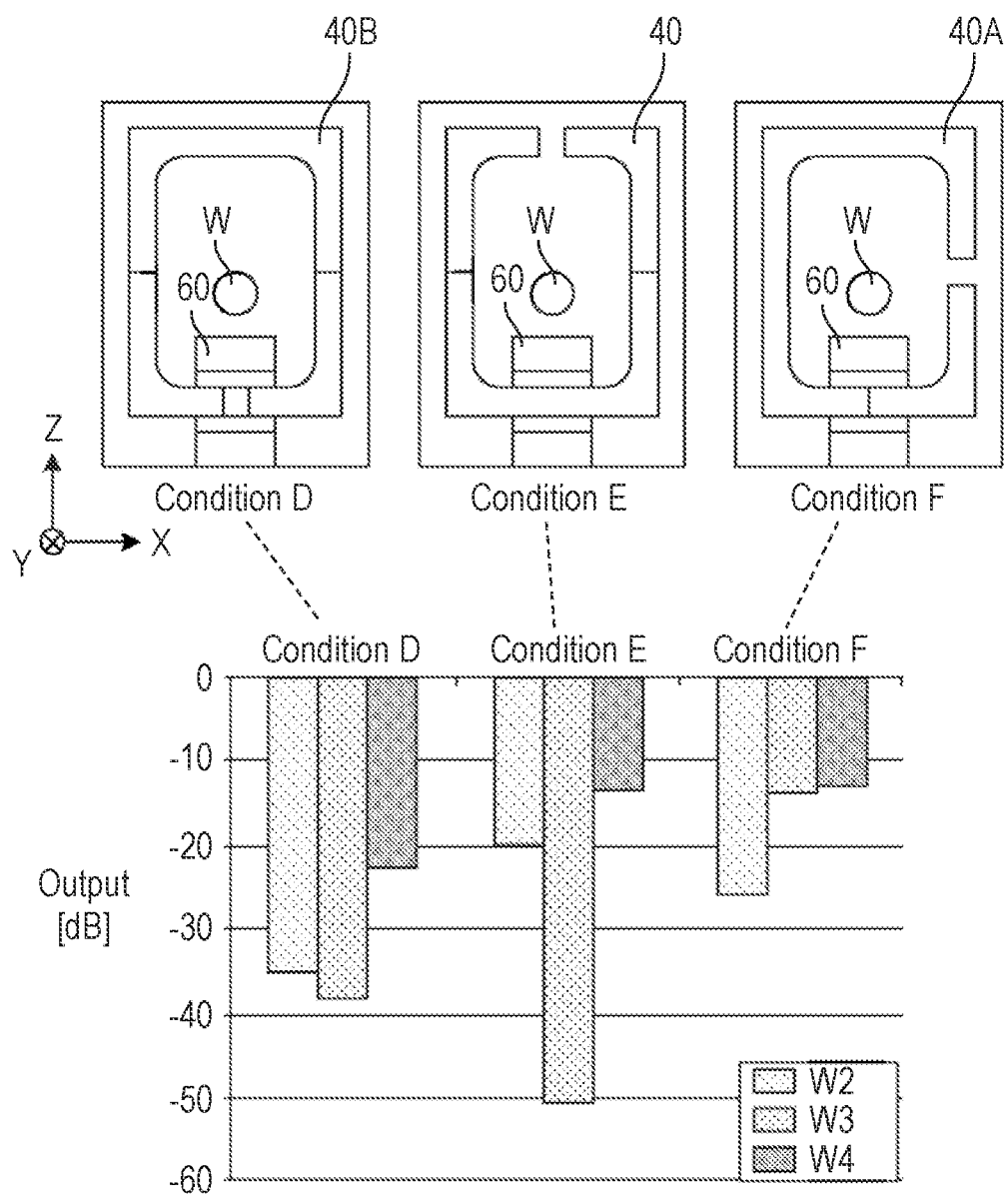
FIG. 16 illustrates the core and an output of the current sensor in accordance with the embodiment.
Figure 17:
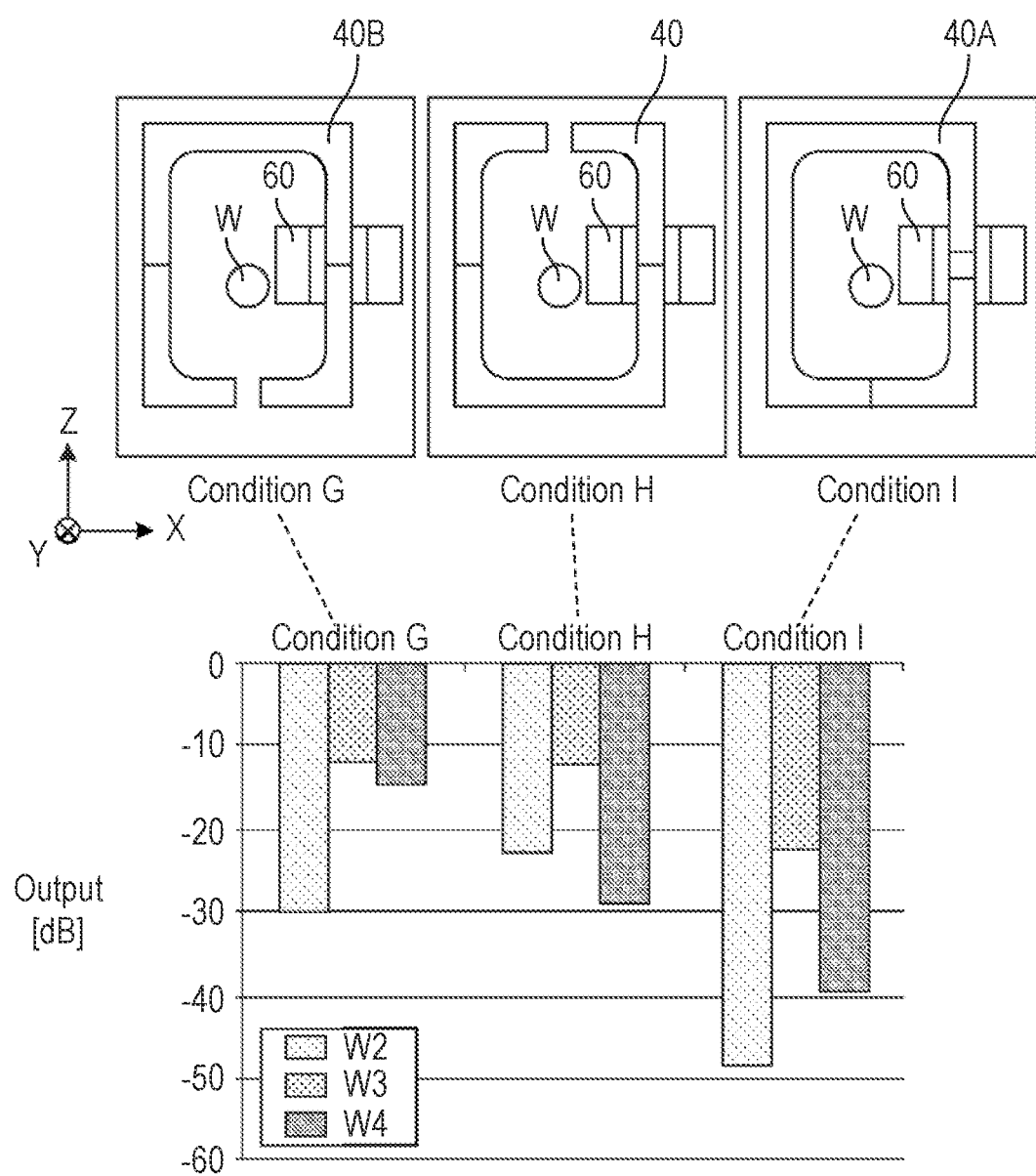
FIG. 17 illustrates the core and an output of the current sensor in accordance with the embodiment.

FIGS. 15 to 17 illustrate the state of cores 40, 40A, and 40B in conditions and sensor output in the conditions. Sensor output in each condition shows an influence of other electrical conductors W2 to W4 on detection of current flowing through electrical conductor W. In a graph showing the sensor output, a smaller output (longer bar graph) signifies a smaller influence on current detection of electrical conductor W.

As shown in FIG. 15, coil 60 is wound at an upper part of core 40B in modified example 2 in condition A. In condition B, coil 60 is wound at an upper part of core 40 in the exemplary embodiment. In condition C, coil 60 is wound at an upper part of core 40A in modified example 1. In other words, gaps Sa and Sb are fully exposed from coil 60 in conditions A and C, but gap S is entirely covered with coil 60 in condition B.

As shown in FIG. 15, condition B provides a smaller influence of any of other electrical conductors W2, W3, and W4 than conditions A and C.

As shown in FIG. 16, in condition D, coil 60 is wound on a lower part of core 40B of modified example 2. In condition E, coil 60 is wound on a lower part of core 40 in accordance with the embodiment. In condition F, coil 60 is wound on a lower part of core 40A of modified example 1. In other words, gaps S and Sb are entirely exposed from coil 60 in conditions E and F, but gap Sa is entirely covered with coil 60 in condition D.

As shown in FIG. 16, condition D provides a larger influence of other electrical conductor W3 but an influence of other electrical conductors W2 and W4 is smaller than condition E. In addition, condition D provides a smaller influence of all of other electrical conductors W2, W3, and W4 than condition F. Therefore, as a whole, condition D provides a smaller influence of other electrical conductors W2, W3, and W4 than conditions F and F.

As shown in FIG. 17, coil 60 is wound on the center on the positive side of X axis of core 40B of modified example 2 in condition G. In condition H, coil 60 is wound on the center part on the positive side of X axis of core 40 in accordance with the embodiment. In condition I, coil 60 is wound on the center part on the positive side of X axis of coil 40A of modified example 1. In other words, gaps S and Sa in conditions G and H are entirely exposed from coil 60, but gap Sb in condition I is entirely covered with coil 60.

As shown in FIG. 17, condition I provides a smaller influence of any of other electrical conductors W2, W3, and W4 than conditions G and H.

Conditions B, E, and H related to core 40 in accordance with the embodiment will be focused below. Condition B in which gap S is surrounded by coil 60 provides a larger influence of other electrical conductor W3 but a smaller influence of other electrical conductors W2 and W4 than condition E. Condition B provides a smaller influence of all of other electrical conductors W2, W3, and W4 than condition H. Therefore, as a whole, condition B provides a smaller influence of electrical conductors W2, W3, and W4 than conditions E and H.

Conditions A, D, and G related to core 40A of modified example 1 will be focused below. Condition D in which gap Sa is surrounded by coil 60 provides a smaller influence of any of other electrical conductors W2, W3, and W4 than conditions A and G.

Conditions C, F, and I related to core 40B of modified example 2 will be focused below. Condition I in which gap Sb is surrounded by coil 60 receives provides a larger influence of other electrical conductor W3 but a smaller influence of other electrical conductors W2 and W4 than condition C. It is apparent that condition I provides a smaller influence of all of other electrical conductors W2, W3, and W4 than condition F. Therefore, as a whole, condition I provides a smaller influence of other electrical conductors W2, W3, and W4 than conditions C and F.

As described above, current sensor 10 includes core 40 (40A, 40B) through which electrical conductor W passes, and coil 60 wound on core 40 (40A, 40B), Core 40 (40A, 40B) has a C-shape and gap S, Sa, or Sb is provided in a part of the C-shape. Coil 60 is wound at a position surrounding gap S (Sa, Sb).

Coil 60 wound on the position surrounding gap S (Sa, Sb) of core 40 (40A, 40B) blocks magnetic flux from external electrical conductors W2 to W5 toward gap S (Sa, Sb). This configuration suppresses an influence of the magnetic flux, i.e., external noise.

The pair of end surfaces (other end surfaces 422 and 432, end surface 442, other end surface 452) of core 40 (40A, 40B) that forth gap S (Sa, Sb) is disposed inside coil 60.

As a result, coil 60 covers both end parts of gap S (Sa, Sb). Therefore, coil 60 reliably blocks magnetic flux from external electrical conductors W2 to W5 toward gap S (Sa, Sb). This configuration suppresses an influence of magnetic flux from external electrical conductors W2 to W5 reliably accordingly.

Another Exemplary Embodiment

Figure 18:
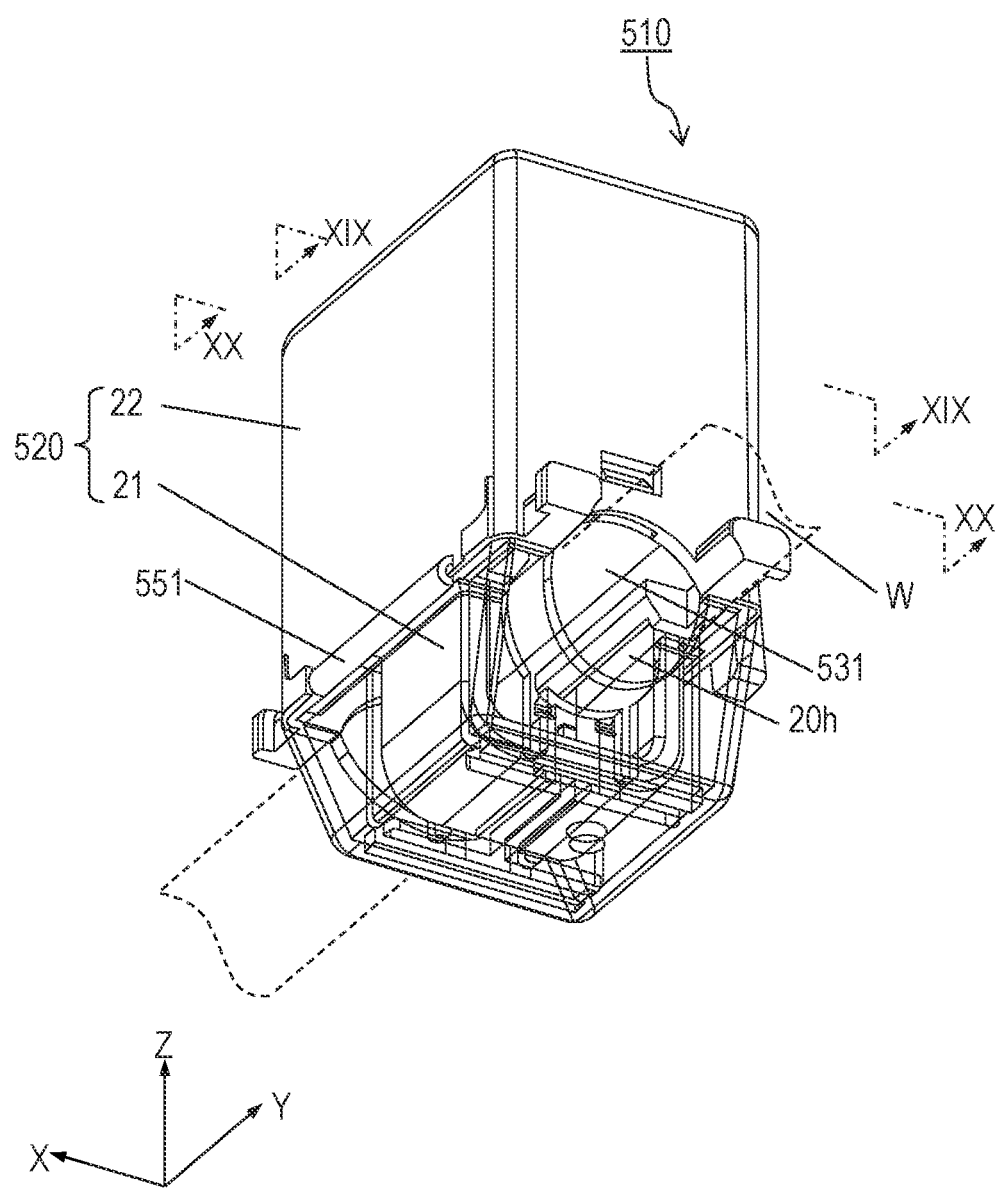
FIG. 18 is a perspective view of another current sensor in accordance with the embodiment.
Figure 19:
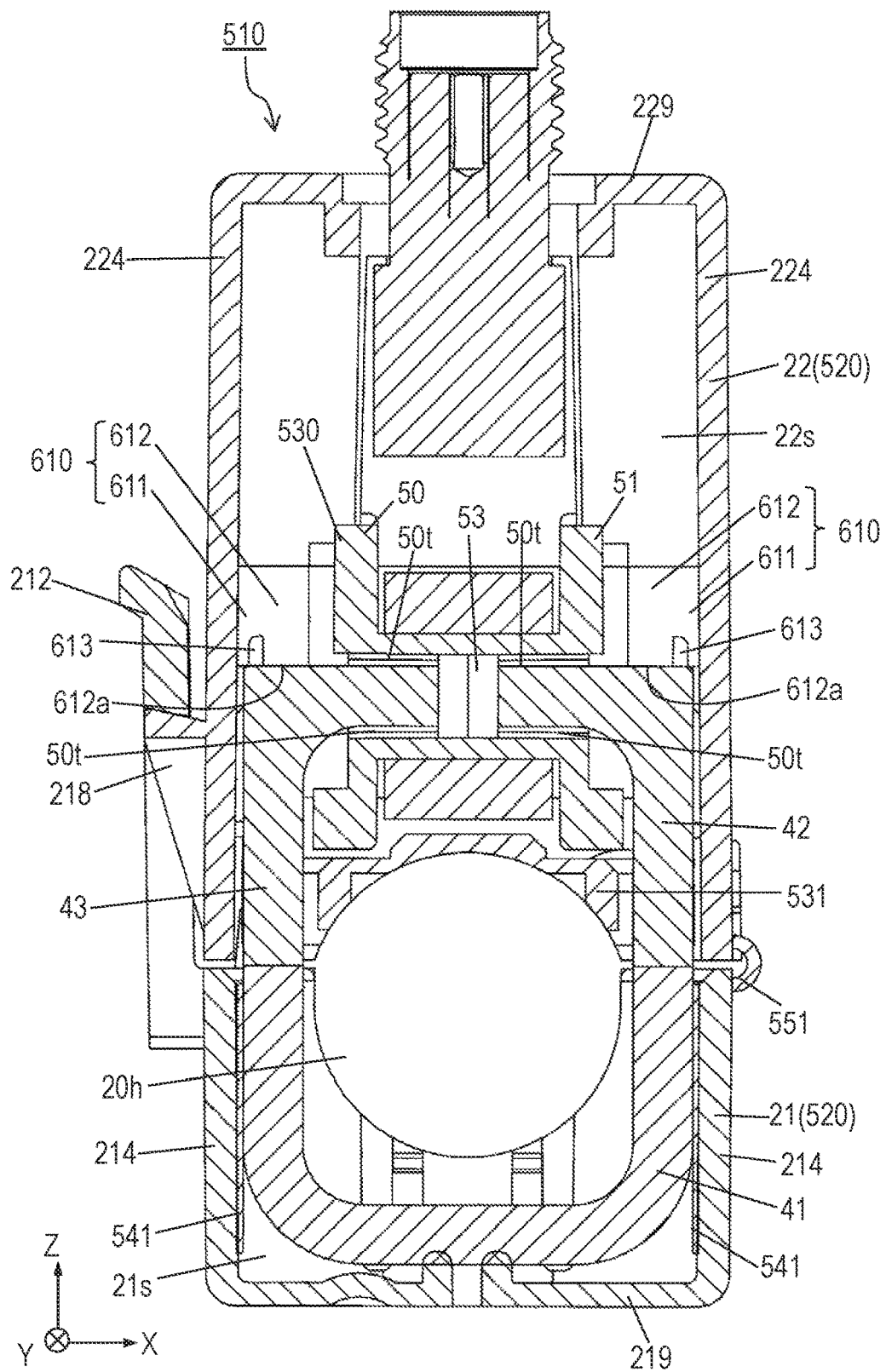
FIG. 19 is a sectional view of the current sensor taken along line XIX-XIX shown in FIG. 18.
Figure 20:
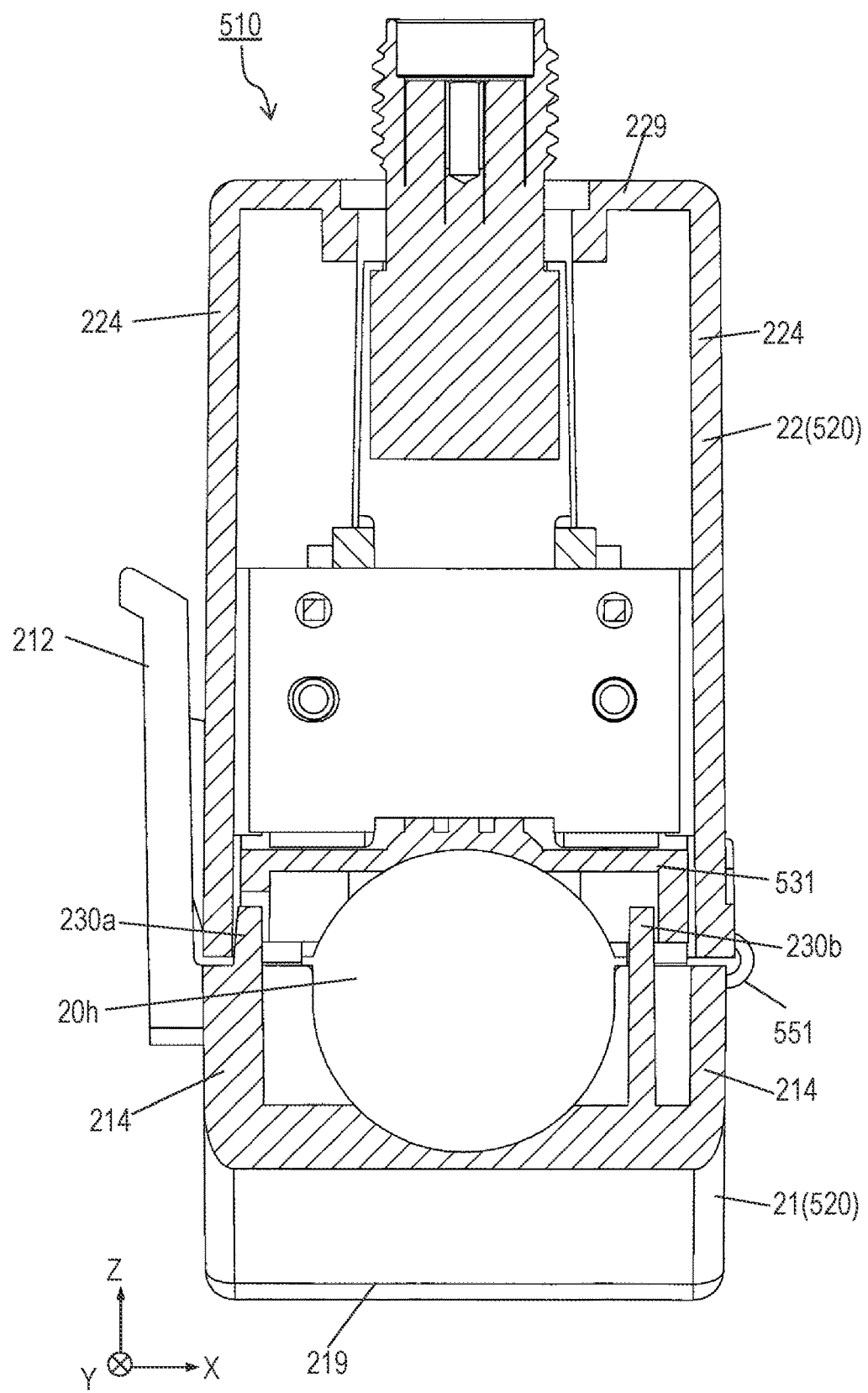
FIG. 20 is a sectional view of the current sensor taken along line XX-XX shown in FIG. 18.

FIG. 18 is a perspective view of another current sensor 510 in accordance with the embodiment. FIG. 19 is a sectional view of current sensor 510 along line XIX-XIX shown in FIG. 18. FIG. 20 is a sectional view of current sensor 510 taken along line XX-XX shown in FIG. 18. In FIGS. 18 to 20, components identical to those of current sensor 10 shown in FIGS. 1 to 5 are denoted by the same reference numerals. Current sensor 510 includes housing 520 and sensor unit accommodated in housing 520.

Figure 21:
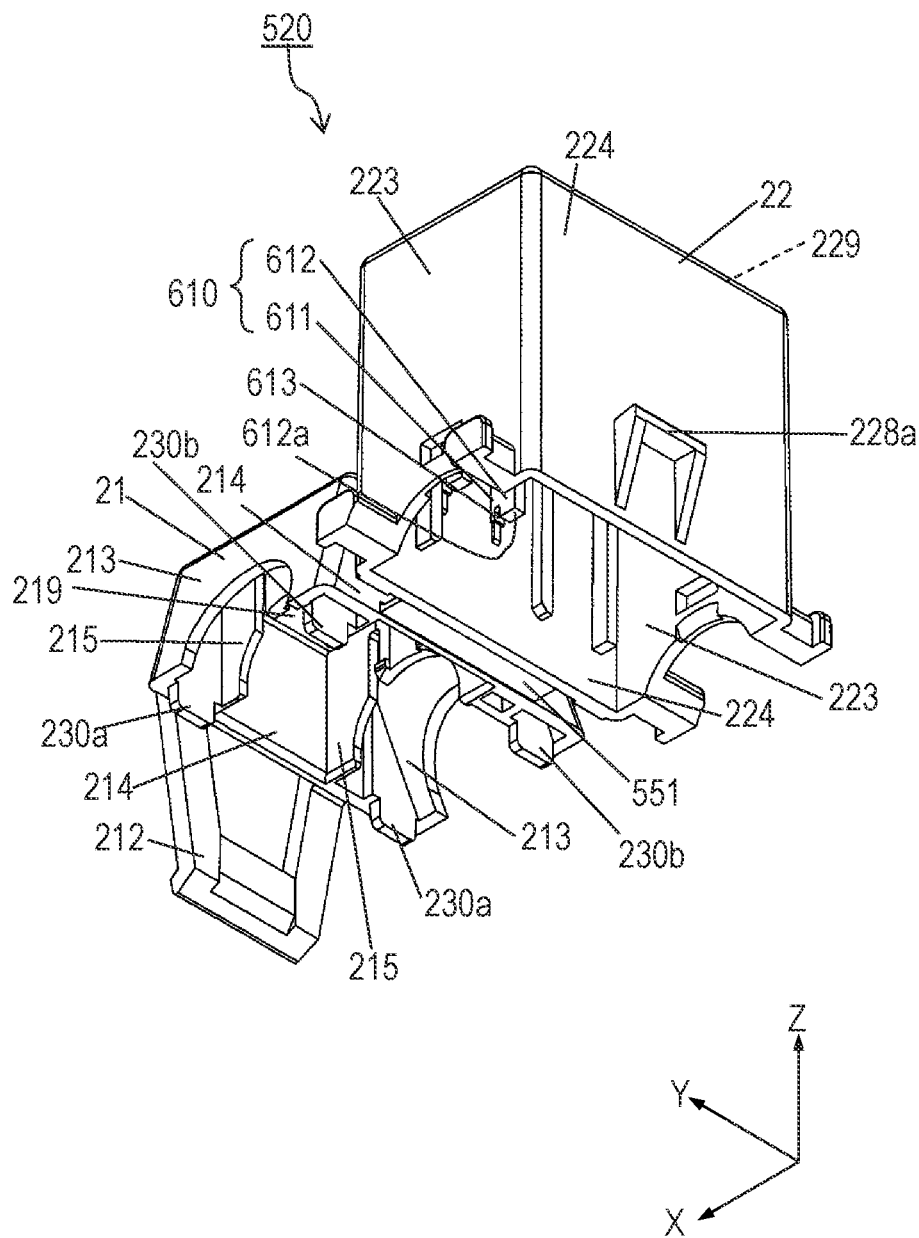
FIG. 21 is a perspective view of a housing of the current sensor shown in FIG. 18.

FIG. 21 is a perspective view of housing 520. In FIG. 21, components identical to those of the housing of current sensor 10 shown in FIG. 1 and FIG. 2 are denoted by the same reference numerals. Housing 520 includes cases 21 and 22 divided in the Z-axis direction, and hinge 551 that connects cases 21 and 22 to each other. Hinge 551 connects one of the pair of lower walls 214 of main body 211 of case 21 with one of the pair of upper walls 224 of main body 221 of case 22.

Case 21 includes main body 211 and locking part 212 to be engaged with case 22. Main body 211 has a box shape having space 21a opening in the positive direction of the Z axis Locking part 212 is provided at a position on the opposite side of hinge 551. Locking part 212 is provided on the other of the pair of lower walls 214 of main body 211 of case 21. Split core 41 that is a part of sensor unit 530 is fitted in and fixed between inner walls 215.

Case 22 has a box shape having space 22s opening in the negative direction of the Z axis. Case 22 includes a pair of upper walls 223 facing each other in the Y-axis direction, a pair of upper walls facing each other in the X-axis direction, and bottom plate 229. Upper walls 223 and 224 are connected to each other and extended ng from bottom plate 229 in the negative direction of the Z axis. Upper walls 223 and 224 and bottom plate 229 surround space 22s.

Fitting protrusion 228a is provided on other outer surface of the pair of upper walls 224 of case 22.

Locking part 212 of case 21 is extended from the outer surface of lower wall 214 in the positive direction of the Z axis. Locking part 212 substantially has a U-shape. Locking part 212 is engaged with fitting protrusion 228a of case 22 by relatively rotating case 21 about hinge 551 with respect to case 22, and case 21 and case 22 are assembled together and fixed to each other.

In current sensor 10 shown in FIG. 3, split cores 42 and 43 contact internal bottom part 511 of bobbin 50, and are also press-fitted into space 50s of bobbin body 51 to be firmly fixed onto bobbin 50. As shown in FIG. 19, in current sensor 510, split cores 42 and 43 contact internal bottom part 511, but split cores 42 and 43 are accommodated in space 50a with clearance 50t from bobbin body 51. Therefore, split cores 42 and 43 are not fixed to bobbin 50 before being accommodated in case 22, but split core 42, split core 43, and bobbin 50 are positioned and firmly fixed in case 22 to retain the shape of sensor unit 530.

As shown in FIGS. 18 to 20, in current sensor 510, inner lid 531 that covers bobbin 50 is provided on an opening of case 22. Inner lid 531 prevents conductive or magnetic foreign particles from entering inside case 22 and protects coil 60 to prevent any influence on detection accuracy of current sensor 530.

In current sensor 510, as shown in FIG. 19 and FIG. 21, case 22 includes rib 610 that protrudes from main body 221 toward space 22s to position split core 41 (42). Rib 610 positions split cores 41 and 42 with respect to case 22 and bobbin 50. When current sensor 510 is assembled, split core 42, split core 43, and bobbin 50 are positioned and firmly fixed with respect to case 22 by press-fitting and inserting split cores 41 and 42 inserted to space 50s of bobbin 50 into case 22. During insertion, split cores 41 and 42 may scrape case 22 and generate scraped particles. The particles may enter between split core 41 (42) and facing surface 612a of rib 610. The particles entering between split core 41 (42) and facing surface 612a of rib 610 may displace split core 41 (42) with respect to rib 610 and prevent the shape of core 40 from being retained, or prevent locking part 212 of case 21 from reaching fitting protrusion 228a on case 22, consequently preventing engagement.

To wipe out the above problem in current sensor 510, rib 610 includes base 611 that protrudes from main body 221 toward space 22s, and positioner 612 that extends from base 611 to split core 41 (42). Positioner 612 has facing surface 612a that faces and contacts split core 41 (42). Positioner 612 is located apart from main body 221 across slit 613 extended from facing surface 612a. This configuration allows the scraped particles at inserting split cores 41 and 42 into case 22 to move through slit 613 to prevent the particles from being left between split core 41 (42) and facing surface 612a of rib 610.

In current sensor 510, case 21 includes protrusions 230a and 230b configured to be fitted inside space 22s so that case 21 contacts main body 221 of case 22 by assembling case 21 and case 22 together. Protrusion 230a protrudes from lower wall 214 of case 21 that does not have hinge 551 and is on the opposite side of hinge 551. Protrusion 230b extends from bottom plate 219 of case 21. Protrusions 230a and 230b contact main body 221, particularly upper walls 223, of case 22 by assembling case 21 and case 22 together. This configuration prevents relative deviation of cases 21 and 22, particularly the rotation of cases 21 and 22 in directions opposite to each other about hinge 551. With this configuration, similarly to current sensor 10, cases 21 and 22 are assembled together and fixed to each other even when a mechanical impact, such as dropping and transfer, is applied. As a result, relative deviation of split cores 41, 42, and 43 are prevented and chipping of split cores 41, 42, and 43 is prevented.

Figure 22:
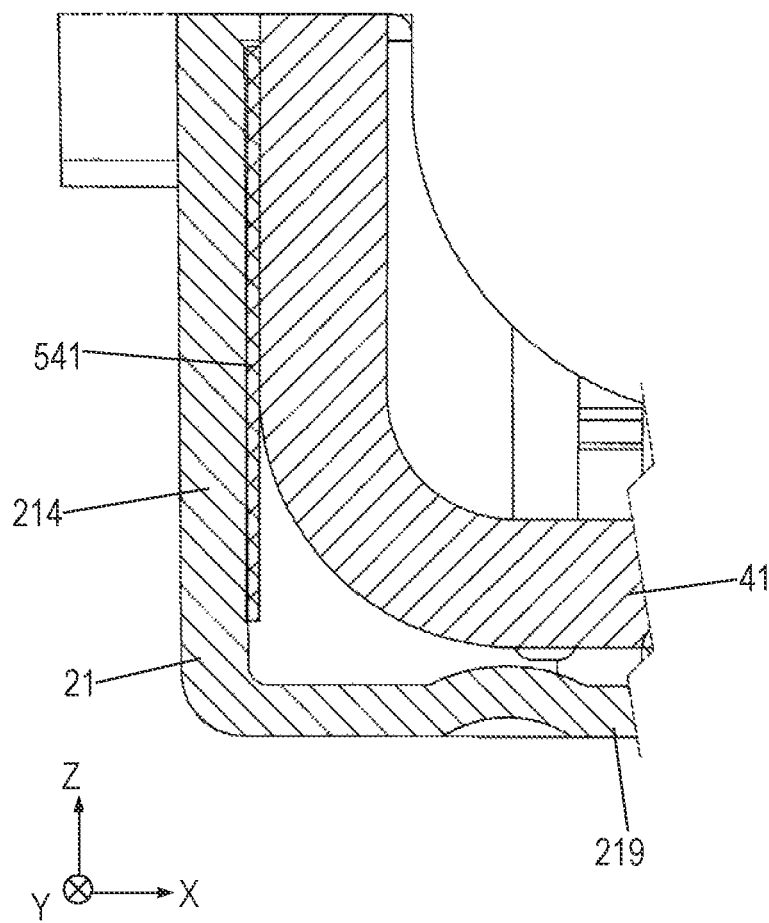
FIG. 22 is an enlarged sectional view of the current sensor shown in FIG. 19.

FIG. 22 is an enlarged sectional view of current sensor 510 in FIG. 19. Current sensor 510 may preferably further include cushion 541 between main body 211 of case 21 and split core 41. Cushion 541 contacts lower wall 214 and split core 41 between split core 41 and in main body 211, particularly lower wall 214. This configuration reliably positions and fixes split core 41 with respect to case 21 to prevent cracking of split cores 41, 42, and 43.

Figure 23:
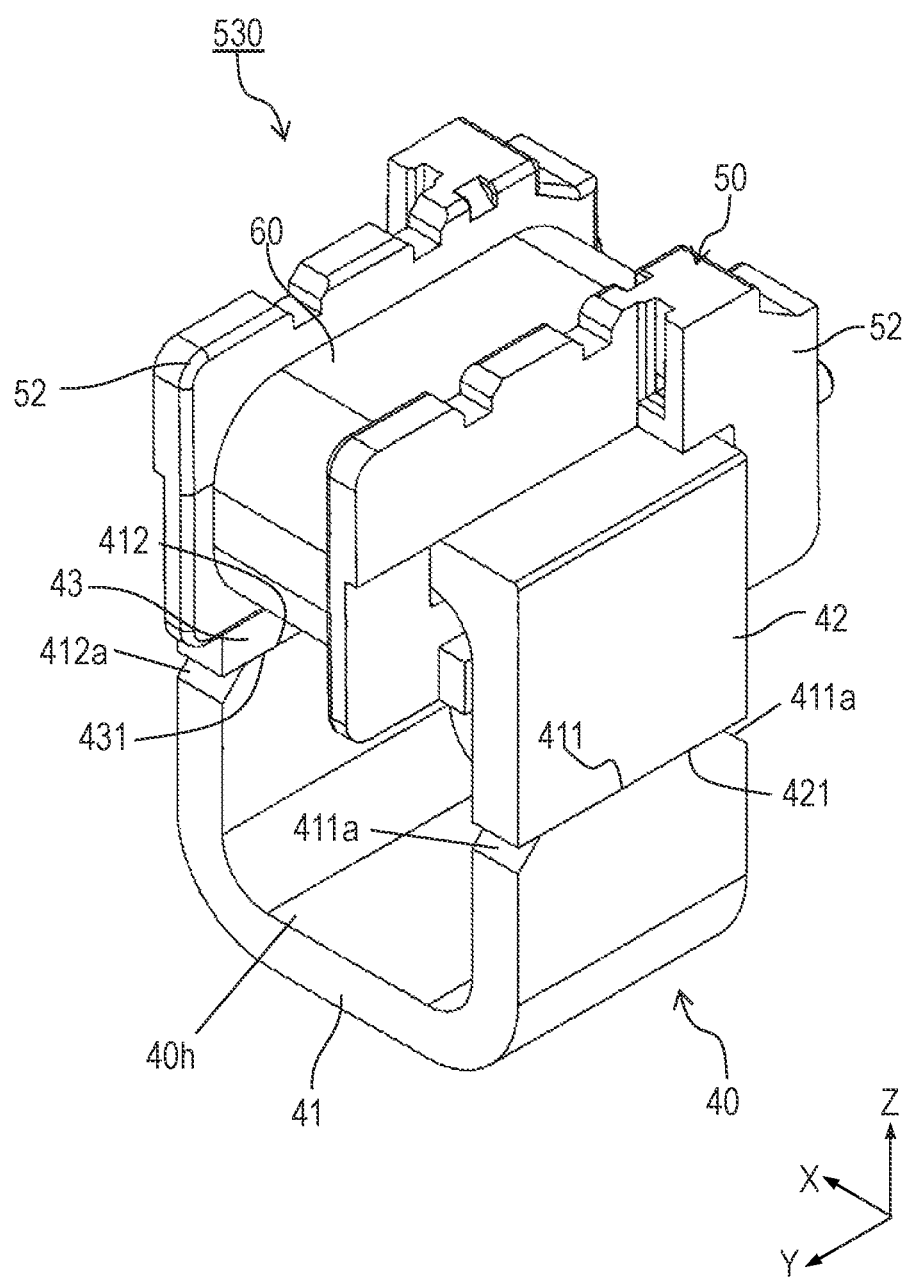
FIG. 23 is a perspective view of a sensor unit of the current sensor shown in FIG. 18.

FIG. 23 is a perspective view of another sensor unit 530 of current sensor 510. In FIG. 23, components identical to those of sensor unit 30 in shown FIG. 4 are denoted by the same reference numerals. By assembling case 21 and case 22 together, joining surface 411 of split core 41 is joined with joining surface 421 of split core 42, and joining surface 412 of split core 41 is joined with joining surface 431 of split core 43. Both ends 411a of joining surface 411 of split core 41 in the Y-axis direction are chamfered. However, either one of both ends 411a may not be chamfered. Both ends 412a of joining surface 412 of split core 41 in the Y-axis direction are chamfered. However, either one of both ends 412a may not be chamfered. This configuration prevents edges of split cores 41, 42, and 43 from directly contacting one another even when a mechanical impact, such as dropping and transfer, is applied, thereby preventing chipping of split cores 41, 42, and 43.

Figure 24:
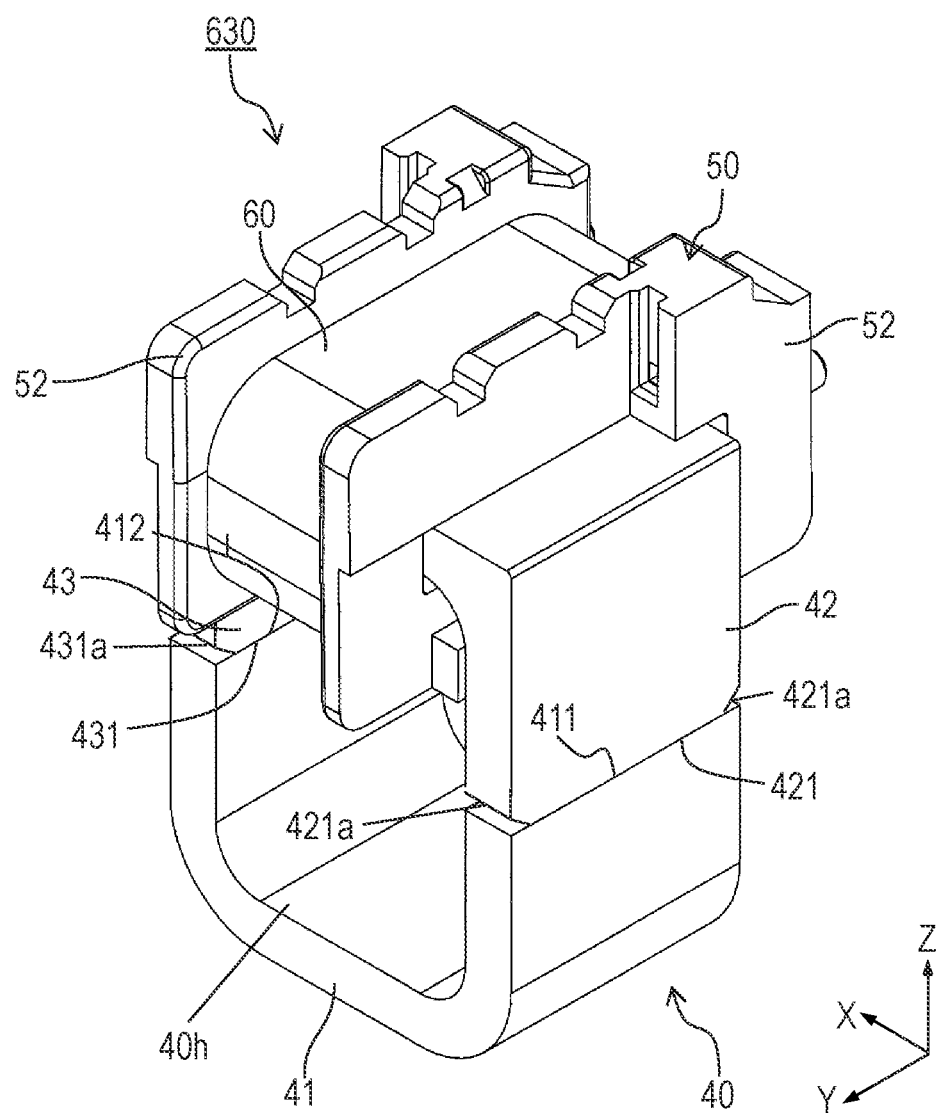
FIG. 24 is a perspective view of another sensor unit of the current sensor shown in FIG. 18.

FIG. 24 is a perspective view of still another sensor unit 630 of current sensor 510. In FIG. 24, components identical to those of sensor unit 530 shown in FIG. 23 are denoted by the same reference numerals. Both ends 421a of joining surface 421 of split core 42 in the Y-axis direction are chamfered. However, either one of both ends 421a may not be chamfered. Both ends 431a of joining surface 431 of split core 43 in the Y-axis direction are chamfered. However, either one of both ends 431a may not be chamfered. This configuration prevents edges of split cores 41, 42, and 43 from directly contacting one another even when a mechanical impact, such as dropping and transfer, is applied, thereby preventing chipping of split cores 41, 42, and 43.

Others

The exemplary embodiments and modified examples of the current sensor in the present disclosure are described above. However, the present disclosure is not limited to the above exemplary embodiments and modified examples.

In the above exemplary embodiments, the core split in two or three is given as an example. However, the core may be split to four or more. Still more, when suppression of an influence of other electrical conductors W2 to W5 is the only consideration, which means adjustment of distance LX of gap S is not considered, the core may not be split.

Furthermore, the present disclosure includes a mode obtained by applying various modifications conceived by those skilled in the art to the exemplary embodiments, and a mode realized by arbitrarily combining components and functions in the exemplary embodiments and the modified examples without departing from the gist of the present disclosure.

REFERENCE MARKS IN THE DRAWINGS 10 current sensor
20 housing
21 case (first case)
22 case (second case)
30 sensor unit
40, 40A, 40B core
41, 42, 43, 44, 45 split core
50 bobbin
51 bobbin body
52 flange
53 internal bottom part
60 coil
211 main body
212 locking part
213 lower wall
213a, 215a, 223a cutout
214 lower wall
215 inner wall
221 main body
223 upper wall
224 upper wall
224a protrusion
224b regulating projection
228a, 228b fitting protrusion
411, 412, 421, 431 joining surface
422, 432, 452 end surface
441, 442 tip surface
451 one end surface
510 current sensor
520 housing
530 sensor unit
630 sensor unit
W electrical conductor

The invention claimed is:

1. A current sensor configured to detect a current flowing through an electrical conductor, the current sensor comprising:
   a core having a hollow configure to allow the electrical conductor to pass through the hollow; and
   a coil wound around the core, wherein:
   the core substantially has a C-shape having a gap connected to the hollow,
   the core has a first end surface and a second end surface which face each other across the gap, the first end surface and the second end surface being directed in directions opposite to each other,
   the C-shape of the core is extended continuously from the first end surface to the second end surface while surrounding the hollow, and
   at least a part of the gap of the core is located inside the coil.

2. The current sensor according to claim 1, wherein the first end surface and the second end surface of the core are located inside the coil.

3. The current sensor according to claim 2, further comprising a bobbin having the coil being wound thereon, the bobbin being made of non-magnetic material, wherein:
   the bobbin has a first internal space and a second internal space provided therein, an end portion of the core including the first end surface being inserted in the first internal space, an end portion of the core including the second end surface being inserted in the second internal space,
   the bobbin includes an internal bottom part provided between the first intern space and the second internal space, and
   the internal bottom part of the bobbin contacts the first end surface of the core and the second end surface of the core.

4. The current sensor according to claim 1, further comprising a bobbin having the coil being wound thereon, the bobbin being made of non-magnetic material.

5. The current sensor according to claim 1, wherein the core includes a plurality of split cores mutually joined.

6. The current sensor according to claim 5, further comprising:
   a first case including a first main body having a space therein accommodating a first split core of the plurality of split cores therein; and
   a second case including a second main body having a space therein accommodating a second split core of the plurality of split cores therein, wherein
   the first split core, the second split core, and the coil are fixed to one another while the first case and the second case are assembled together.

7. The current sensor according to claim 6, wherein
the second case further includes a rib protruding from the second main body toward the space and positions the second split core,
the rib includes:
a base that protrudes from the second main body to the space, and
a positioner extended from the base toward the second split core, positions the second split core, the positioner having a surface facing the second split core, the surface of the positioner positioning the second split core thereon, and
the positioner of the rib is apart from the second main body via a slit extended from the surface of the positioner.

8. The current sensor according to claim 6, wherein the first case includes a projection, the projection of the first case being configured to be enter in the space and contact the second main body of the second case while the first case and the second case are assembled together.

9. The current sensor according to claim 6, wherein
a joining surface of the first split core is joined with a joining surface of the second split core while the first case and the second case are assembled together, and
an end of the joining surface of the first split core is chamfered.

10. The current sensor according to claim 9, wherein both ends of the joining surface of the first split core are chamfered.

11. The current sensor according to claim 6, wherein
a joining surface of the first split core is joined with a joining surface of the second split core while the first case and the second case are assembled together, and
an end of the joining surface of the second split core is chamfered.

12. The current sensor according to claim 11, wherein both ends of the joining surface of the second split core are chamfered.

13. A current sensor configured to detect a current flowing through an electrical conductor, the current sensor comprising:
a core having a hollow configure to allow the electrical conductor to pass through the hollow; and
a coil wound around the core, wherein:
the core substantially has a C-shape having a gap connected to the hollow,
at least a part of the gap of the core is located inside the coil,
the core includes a plurality of split cores mutually joined,
the current sensor further comprises:
a first case including a first main body having a space therein accommodating a first split core of the plurality of split cores therein; and
a second case including a second main body having a space therein accommodating a second split core of the plurality of split cores therein,
the first split core, the second split core, and the coil are fixed to one another while the first case and the second case are assembled together,
the second case further includes a rib protruding from the second main body toward the space and positions the second split core,
the rib includes:
a base that protrudes from the second main body to the space, and
a positioner extended from the base toward the second split core, positions the second split core, the positioner having a surface facing the second split core, the surface of the positioner positioning the second split core thereon, and
the positioner of the rib is apart from the second main body via a slit extended from the surface of the positioner.

14. The current sensor according to claim 13, wherein:
the core has a pair of end surfaces facing each other across the gap, and
the pair of end surfaces of the core are located inside the coil.

15. The current sensor according to claim 13, further comprising a bobbin having the coil being wound thereon, the bobbin being made of non-magnetic material.

16. The current sensor according to claim 13, wherein the first case includes a projection, the projection of the first case being configured to be enter in the space and contact the second main body of the second case while the first case and the second case are assembled together.

17. The current sensor according to claim 13, wherein:
a joining surface of the first split core is joined with a joining surface of the second split core while the first case and the second case are assembled together, and
an end of the joining surface of the first split core is chamfered.

18. The current sensor according to claim 17, wherein both ends of the joining surface of the first split core are chamfered.

19. The current sensor according to claim 13, wherein:
a joining surface of the first split core is joined with a joining surface of the second split core while the first case and the second case are assembled together, and
an end of the joining surface of the second split core is chamfered.

20. The current sensor according to claim 19, wherein both ends of the joining surface of the second split core are chamfered.

* * * * *